(12) United States Patent
Kundu et al.

(10) Patent No.: US 12,265,483 B2
(45) Date of Patent: Apr. 1, 2025

(54) SHUNT-SERIES AND SERIES-SHUNT INDUCTIVELY PEAKED CLOCK BUFFER, AND ASYMMETRIC MULTIPLEXER AND DE-MULTIPLEXER

(71) Applicant: Intel Corporation, Santa Clara, CA (US)

(72) Inventors: Sandipan Kundu, Hillsboro, OR (US); Jihwan Kim, Portland, OR (US); Ajay Balankutty, Hillsboro, OR (US); Bong Chan Kim, Hillsboro, OR (US); Yutao Liu, Hillsboro, OR (US); Frank O'Mahony, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 681 days.

(21) Appl. No.: 17/338,479

(22) Filed: Jun. 3, 2021

(65) Prior Publication Data

US 2022/0171718 A1 Jun. 2, 2022

Related U.S. Application Data

(60) Provisional application No. 63/120,646, filed on Dec. 2, 2020.

(51) Int. Cl.
*G06F 13/42* (2006.01)
*G06F 1/04* (2006.01)
(Continued)

(52) U.S. Cl.
CPC ............ *G06F 13/1668* (2013.01); *G06F 1/04* (2013.01); *G06F 13/4282* (2013.01); *H03K 17/6872* (2013.01); *H03K 19/20* (2013.01)

(58) Field of Classification Search
None
See application file for complete search history.

(56) References Cited

U.S. PATENT DOCUMENTS

| 9,792,962 | B1 * | 10/2017 | La Rosa | G11C 7/08 |
| 2007/0052467 | A1 * | 3/2007 | Cao | H03K 5/07 |
| | | | | 327/280 |

(Continued)

OTHER PUBLICATIONS

Casper et al., "Clocking Analysis, Implementation and Measurement Techniques for High-Speed Data Links—A Tutorial", IEEE Transactions on Circuits and Systems—I: Regular Papers, vol. 56, No. 1, Jan. 2009, pp. 17-39.

*Primary Examiner* — Henry Tsai
*Assistant Examiner* — Dean Phan
(74) *Attorney, Agent, or Firm* — NICHOLSON DE VOS WEBSTER & ELLIOTT LLP

(57) ABSTRACT

A clock buffer that uses low-to-medium quality factor (e.g., QF of 2 to 5) inductors in shunt-series and in series-shunt configuration in high-speed clock distribution stages. Shunt-series and series-shunt inductors extend amplifier bandwidth. Applying shunt-series and series-shunt inductors to high-speed clock distribution filters jitter, attenuates supply noise, and improves fanout. An asymmetric multiplexer with inductors in shunt or in shunt-series configurations. Another asymmetric multiplexer with capacitively coupled tri-stateable inverter-based buffer stages. These two multiplexer techniques along with the ability to 'hide' a load of a non-preferred path at a virtual ground node of the shunt inductor, the multiplexer improves the jitter and power consumption of the preferred path significantly. A de-multiplexer (DeMux) is also shown using inductors. A combination of a shunt-multiplexer and an inductor-based DeMux is also discussed.

20 Claims, 31 Drawing Sheets

(51) Int. Cl.
    *G06F 13/16*     (2006.01)
    *H03K 17/687*     (2006.01)
    *H03K 19/20*     (2006.01)

(56) References Cited

U.S. PATENT DOCUMENTS

2019/0103839 A1* 4/2019 Lee .......................... H03F 3/193
2021/0135647 A1* 5/2021 Mao .......................... H04B 1/44

* cited by examiner

700

SHUNT-SERIES AND SERIES-SHUNT INDUCTIVELY PEAKED CLOCK BUFFER, AND ASYMMETRIC MULTIPLEXER AND DE-MULTIPLEXER

CLAIM OF PRIORITY

This application claims priority of U.S. Provisional Application No. 63/120,646 titled "Shunt-Series and Series-Shunt Inductively Peaked Clock Buffer, and Asymmetric Multiplexer and De-Multiplexer," filed Dec. 2, 2020, which is incorporated by reference in its entirety.

BACKGROUND

Long-reach wireline serial IO (e.g., serializer-deserializer (SerDes)) with per-pin data-rate of 112 G-PAM4 (pulse amplitude modulation with 4 amplitude levels) and achieving 1-1.5 pJ/bit energy efficiency is already in deployment in the industry. Next-generation 224 G-PAM4 is currently under development. Quarter-rate clocking architecture for a SerDes transmitter (TX) is a common choice at these baud rates to reduce overall power consumption and achieve good jitter performance. This means that while a 112 G-PAM4 (56 Gbaud) quarter-rate PAM4 SerDes TX can use 14 GHz clocks, for 224 G-PAM4 (112 Gbaud) 28 GHz clocks are needed to propagate from a voltage-controlled oscillator (VCO) to the TX's one unit-interval (1-UI) pulse generators (pulsegen). Since 1-UI duration is halved in the 224 G-PAM4 case compared to previous 112 G-PAM4, jitter specification (both random and deterministic) also needs to improve by roughly 2× to achieve similar eye margins. A significant portion of the high-frequency random jitter (RJ) comes from thermal-noise-induced jitter in the clock buffers.

In the first order, 4× higher power is needed to reduce this RJ by 2×, all else remaining constant (in reality, this factor is much higher than 4× due to severe jitter amplification seen at 28 GHz clock buffers). Also, a 2× clock frequency uses nominally 2× clocking power ($CV^2f$). This means that moving from 112 G-PAM4 to 224 G-PAM4 entails 8× or even higher clocking power, thus, blowing up the overall energy efficiency budget which remains at 1.5 pJ/bit in 224G case for the TX (clocking usually amounts to about 50% of this number). So, meeting the jitter specification at 224 G-PAM4 operation with similar energy efficiency of a 112 G-PAM4 TX is a challenge.

In addition to the above challenges, SerDes standards use multiple clock frequencies ranging from near DC to the highest clock frequency (e.g., 28 GHz) for efficient multi data-rate operation. In a typical SerDes clock distribution scheme, multiple phase locked loops (PLLs) are used. These PLLs also need to have divided clock paths that are used to support a continuous, hole free clock frequency span. As a result, multiple multiplexers (Mux) and at least one demultiplexer (DeMux) are used to propagate either a full-rate clock or a programmable, divided version. These Mux and DeMux are performance bottlenecks at higher frequencies (e.g., 28 GHz), meaning that the low-frequency requirements degrade the highest-frequency clock quality. Note that the highest frequency clock (e.g., 28 GHz) also needs the lowest jitter as TX jitter budget gets more stringent with a smaller 1-UI duration. Lower clock frequencies can tolerate more jitter as TX jitter budget becomes relaxed. Existing Mux and DeMux suffer from significantly more random jitter issues than their inverter counterparts due to presence of series switches which lowers the fanout and thus generates more thermal noise and amplifies more of the incoming jitter compared to a traditional inverter-based clock buffer stage.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
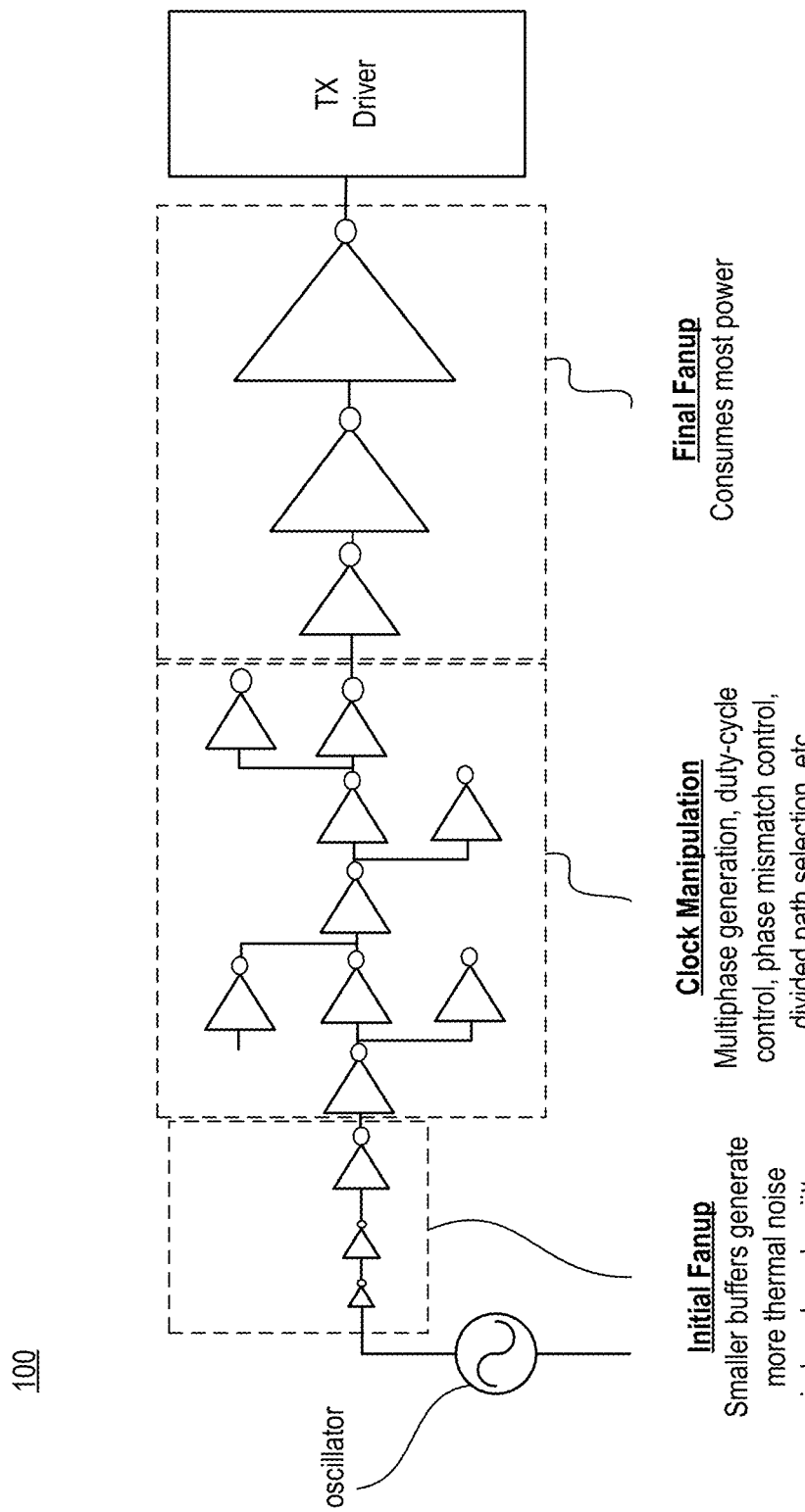
FIG. 1 illustrates a typical clock distribution for serializer-deserializer (SerDes) transmitter (TX).

Some embodiments describe an apparatus that uses inductors in shunt-series and in series-shunt configuration in some of the clock distribution stages to (1) filter random jitter (RJ) thus attenuating it instead of amplifying, (2) cancel some of the power supply induced deterministic jitter (DJ) coming from other non-inductive stages, and (3) support higher fanout without degrading swing to lower overall power consumption drastically. The apparatus when applied to high-speed clock distribution for baseband communication, enables high-speed operation (e.g., 224 Gb/s or greater) achieving best in class jitter numbers.

Some embodiments use low-to-medium quality factor (e.g., QF of 2 to 5), miniature inductors in shunt-series and in series-shunt configuration in high-speed clock distribution stages. Shunt-series and series-shunt inductors extend amplifier bandwidth. Applying shunt-series and/or series-shunt inductors to high-speed clock distribution filters jitter, attenuates supply noise, and improves fanout.

Some embodiments take advantage of the inherent asymmetric requirements of multiplexers (MUXs) and demultiplexers (DeMUXs) in multi-rate serial-de-serializer (SerDes) clock distribution by (1) using inductors in shunt or in shunt-series configurations, and (2) using capacitively coupled tri-stateable inverter-based buffer stages. By using these two techniques along with the ability to "hide" the load of the non-preferred path at the virtual ground node of the shunt inductor, the apparatus of some embodiments improves the jitter and power consumption of the preferred path significantly.

There are many technical effects of various embodiments. For example, the apparatus of some embodiments enables high-speed, low-jitter clock distribution for robust, energy efficient 224 Gb/s transceivers. The apparatus of some embodiments can be incorporated as SerDes intellectual property (IP) block for 112 Gb/s and 224 Gb/s per-pin data-rate with high performance and power efficiency. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1 illustrates a typical clock distribution 100 for serial-deserializer (SerDes) transmitter (TX). After obtaining the clock from a voltage-controlled oscillator (VCO), certain clock manipulation functions are performed, such as multiphase generation duty cycle and phase correction, before fanning up the clock to drive the final large load of the Tx pulse generators (TX Driver). The smaller buffers typically used in the early stages generate most of the thermal-noise-induced random jitter while all the subsequent stages amplify their incoming random jitter (RJ) in addition to adding their own thermal noise induced jitter.

A traditional inverter-based complementary metal oxide semiconductor (CMOS) clock buffer used in such clock distribution stages suffers from severe bandwidth degradation in worst-case process, voltage and temperature (PVT) corner when operating at high frequencies.

Figures 2A, 2B:
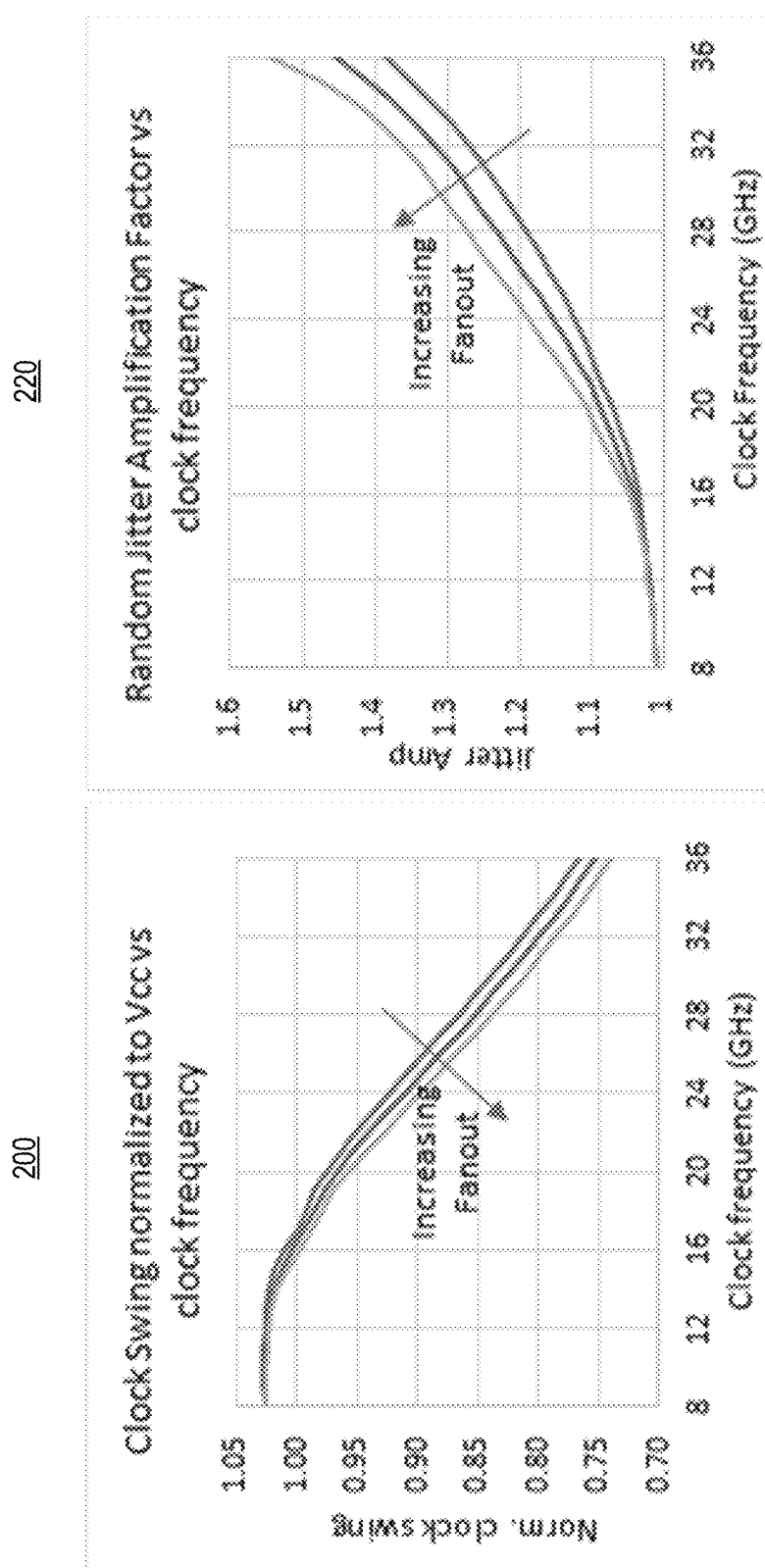
FIGS. 2A-B illustrate a set of plots showing bandwidth degradation using inverter-based CMOS clock buffer, and random jitter amplification as clock frequency increases.

FIGS. 2A-B illustrate a set of plots 200 and 220, respectively, showing bandwidth degradation using inverter-based CMOS clock buffer, and random jitter amplification as clock frequency increases, respectively. Plot 200 shows that inverter-based CMOS clock buffer suffers from reduced output voltage swing as fanout increases and clock frequency increases (e.g., at 28 GHz and higher). This bandwidth degradation also amounts to severe jitter amplification as shown in plot 220. As shown in plot 220, the clock buffer offers very little jitter amplification at 14 GHz, thus multiple such stages can safely be used in 112 G SerDes. On the other hand, at 28 GHz the high value of jitter amplification forces the use of very low fanout which in turn increases power consumption significantly.

Note that current mode logic (CML) sometimes is used as a clock buffer stage but also suffers from similar jitter amplification at high frequencies such as 28 GHz operation. In addition, since the transistors used in CML logic are always in saturation, they generate significantly more thermal-noise-induced jitter compared to their CMOS counterpart. Further, the TX pulse generator requires full-scale swing for best operation. So, CMOS type buffers are used anyway at the end of the clock distribution.

Shunt inductors are used in improving clocking power by resonating clock load in custom logic and microprocessor intellectual property (IP) blocks and sometimes in lower speed IO clocking. Series inductor and series transmission line segments are used either to set up a standing wave to minimize clock skew over large areas or to distribute low swing clocks over a large distance by terminated transmission lines. In all these cases, only one clock buffer stage of the distribution uses such an inductor, which is not sufficient for 224 G SerDes clock distribution. Also, both shunt and series inductors are not used together in a same clock buffer stage. As described herein, some embodiments, using both shunt and series inductors, achieve a proper balance between jitter filtering and clock swing preservation over multiple stages with different sizes.

Some embodiments use low-to-medium quality factor (e.g., 2-5), miniature inductors in shunt-series and in series-shunt configuration in high-speed clock distribution stages. Shunt-series and series-shunt inductors are used to extend amplifier bandwidth. Some embodiments use shunt-series and series-shunt inductors in high-speed clock distribution to filter jitter, attenuate supply noise, and improve fanout.

Figure 3A:
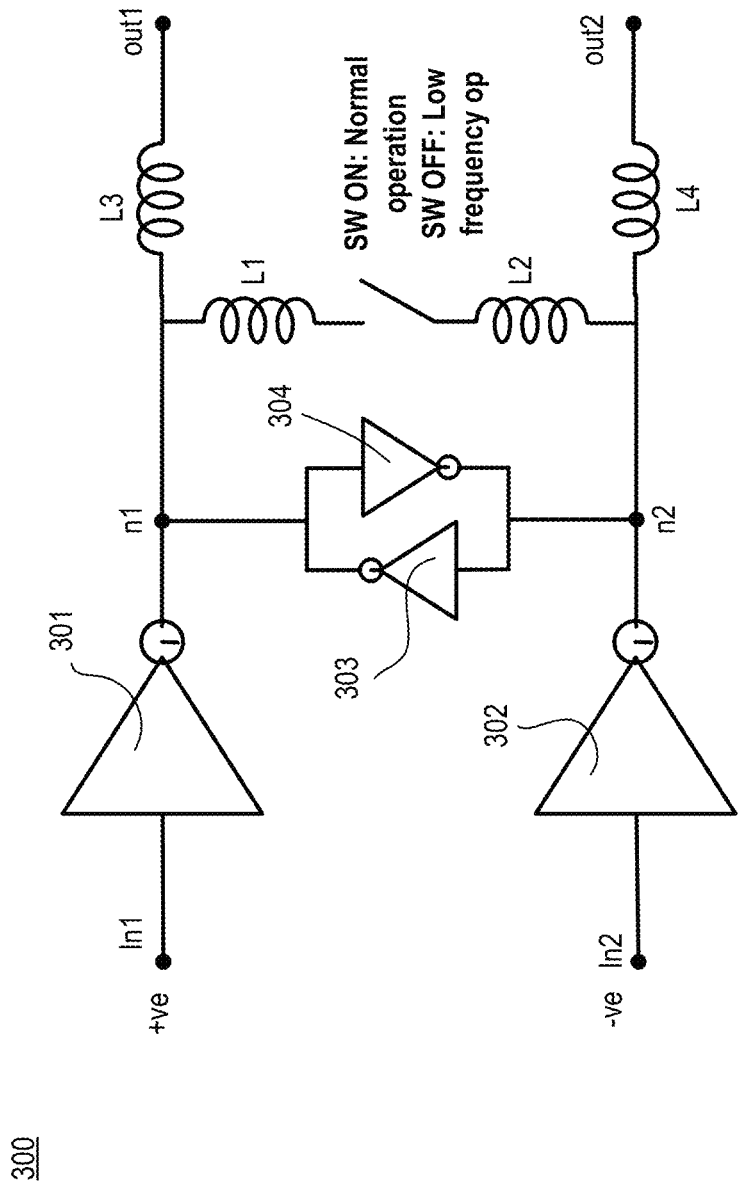
FIG. 3A illustrates a shunt-series peaked inductive clock buffer, in accordance with some embodiments.

FIG. 3A illustrates a shunt-series peaked inductive clock buffer 300, in accordance with some embodiments. Buffer 300 comprises inverters 301, 302, 303, and 304, shunt inductors L1 and L2, series inductors L3 and L4, and switch SW coupled as shown. While the embodiment illustrates a differential clock buffer having inputs In1 and In2 (where In2 is complementary of In1) and differential outputs out1 and out2 (where out2 is complementary of out1), the embodiments are applicable to single-ended clock buffer too. In some embodiments, the inductance of inductors L1 and L2 is higher than the inductance of inductors L3 and L4. For example, inductance of inductor L1 is 3× higher than inductance of inductor L3. In various embodiments, the series inductors L3 and L4 provide extra peaking. In some embodiments, inverters 301 and 302 are power gated. In some embodiments, a memory element comprising inverters 303 and 304 are smaller than inverters 301 and 302. For example, inverters 303 and 304 are eight times smaller than inverters 301 and 302. In various embodiments, the memory element maintains good common mode voltage on nodes n1 and n2. In some embodiments, the cross-coupling set of inverters 303 and 304 that form the memory element are removed.

In some embodiments, the two shunt inductors L1 and L2 are shorted with a switch SW at the virtual ground node. This switch is used to enable low frequency clock propagation as multi data-rate support is needed by SerDes standards (e.g., down to 1 GHz clocks). Note that the capacitance of the switch (which is implemented as a transistor) may be of little consequence for the normal high-speed operation mode (switch ON) since it is at the virtual ground and hence not 'seen' by the forward path.

Figure 3B:
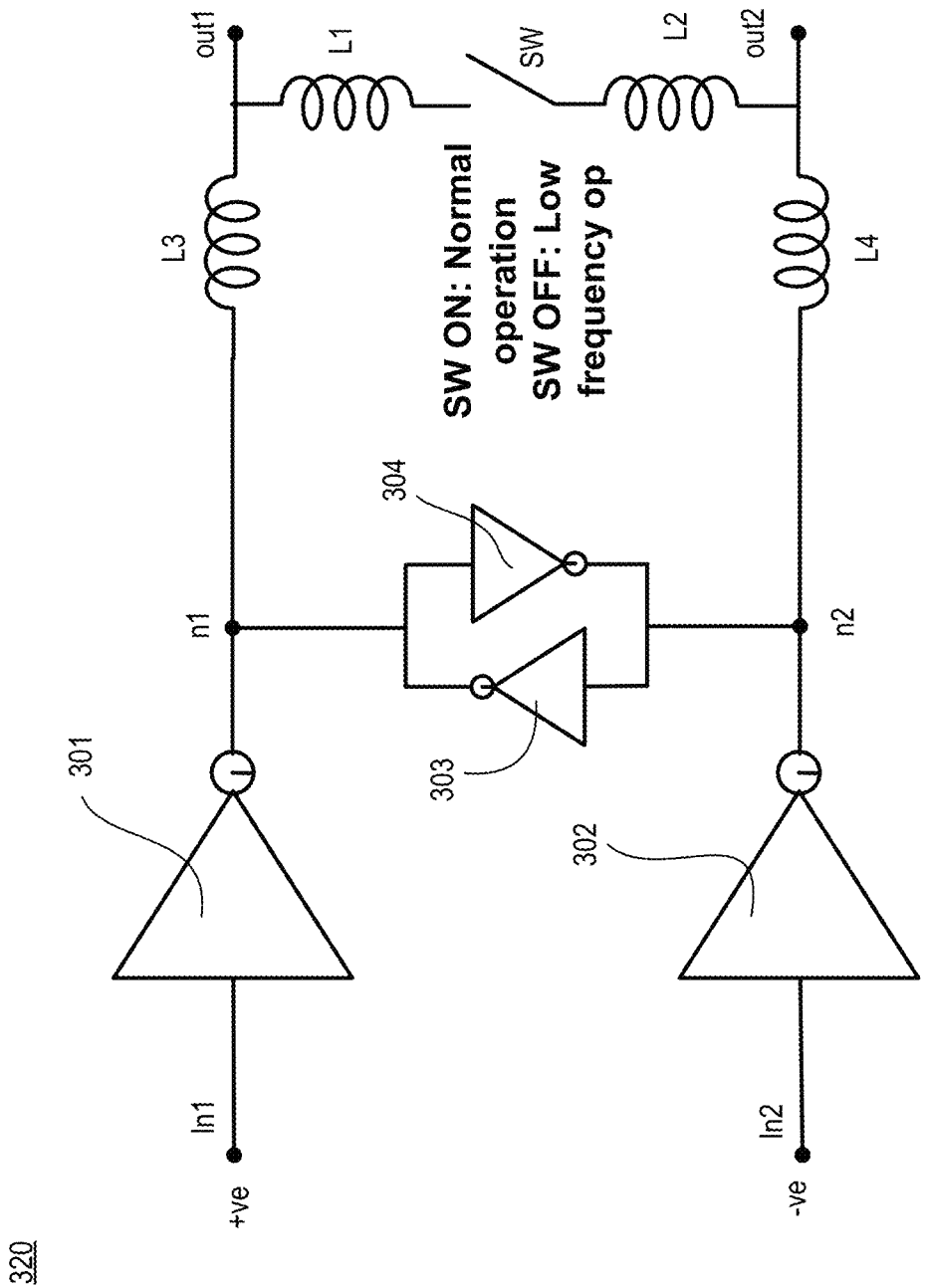
FIG. 3B illustrates a series-shunt peaked inductive clock buffer, in accordance with some embodiments.

FIG. 3B illustrates a series-shunt peaked inductive clock buffer 320, in accordance with some embodiments. Buffer 320 is similar to buffer 300 but for the arrangement of the inductors. Instead of shunt-series inductors, here the inductors L1 and L2 are in series-shunt configuration. The series-shunt inductive clock buffer 320 has a very similar operation as buffer 300 but in this case the inductor order is flipped—series inductor first and then the shunt inductor.

In some embodiments, the shunt inductor of the shunt-series and series-shunt topology filters the incoming thermal noise induced random jitter (RJ), whereas the series inductor provides higher clock swing at the output which is crucial to reduce noise generation and improve RJ filtering of the subsequent stages. Converting one stage of a traditional CMOS clock distribution to shunt-series provides superior final RJ compared to just shunt only. The series-shunt provides similar RJ filtering action but uses higher inductance values (e.g., 50% higher inductance) for iso-load capacitance than a shunt-series stage. One advantage of series-shunt topology is that it can achieve lower power consumption (e.g., about 20% lower) than shunt-series stage for iso conditions which makes it a suitable choice at the very last stage of a clock distribution which typically consumes majority of the total power.

Figure 4:
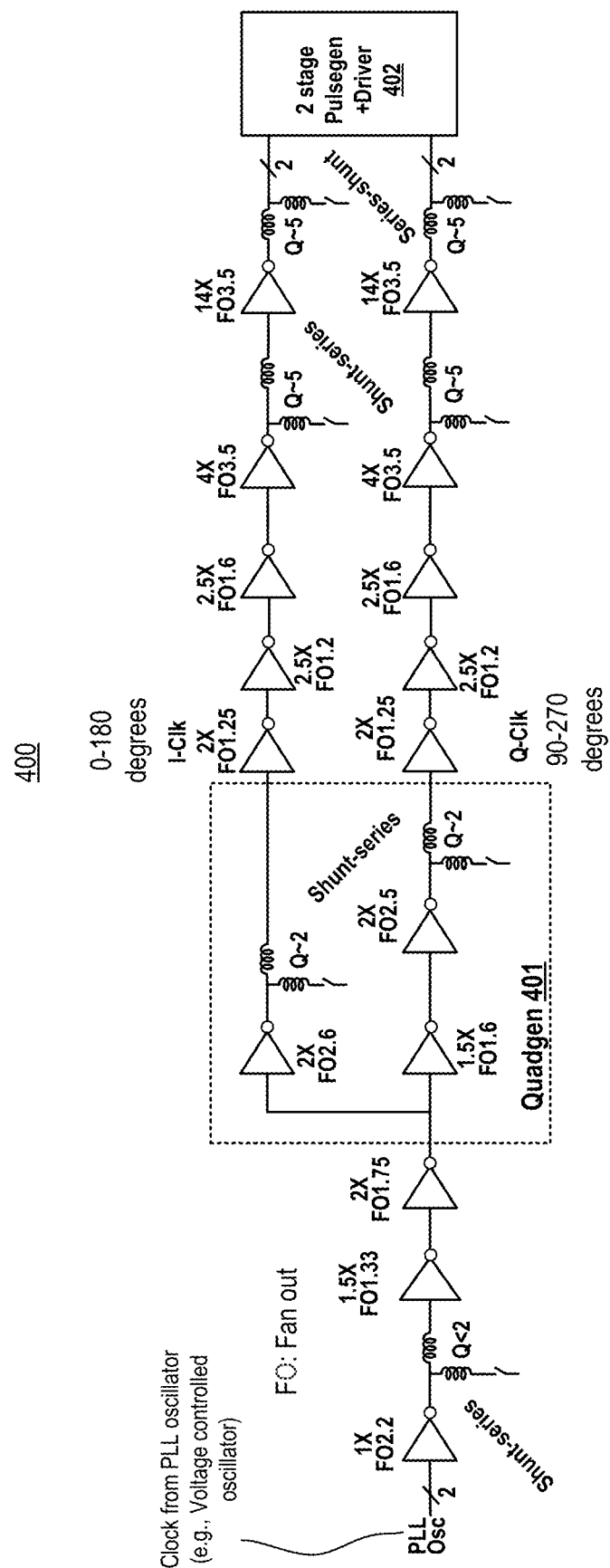
FIG. 4 illustrates a single-ended portion of a differential clock distribution, in accordance with some embodiments.

FIG. 4 illustrates a single-ended portion of a differential clock distribution 400, in accordance with some embodiments. Clock distribution network 400 uses shunt-series and series-shunt inductive clock buffer stages. Clock is received from a PLL and then split by Quadrature Generator (Quadgen) 401 into two paths, and eventually provided to a 2-stage pulse generator and driver 402. Due to area consideration of the intellectual property (IP) block, it may not be practical to use inductors in every stage of a high-speed clock distribution. However, some embodiments use inductors at every stage. In this example, a judicious methodology is followed to arrive at the correct tradeoff between power, area and performance (RJ and deterministic jitter (DJ)).

The clock distribution example of FIG. 4 illustrates a 28 GHz clock distribution. Here, normalized stage sizes and their device only fanouts are shown (Note: additional loading from other sources (e.g. phase spacing correction etc.) are included in the fanout calculations but these loads are not shown here explicitly). Also note that merely a single-ended circuit is shown here, and actual circuit may be differential. In the differential case, the switches connected to shunt inductors goes to the other side of the differential circuit).

In some area constraint cases, some or all the inductive stages may be placed at the end of the distribution so as to cancel all the RJ and DJ coming from the initial inductor-less stages, in accordance with some embodiments. In some embodiments, the inductive stages are distributed in the clock distribution network. Since the RJ filtering effect has a frequency characteristic (it attenuates noise frequency close to clock frequency, say in the 14 GHz to 42 GHz offset frequency range but doesn't attenuate in 0-14 GHz or 42-56 GHz range assuming clock frequency is 28 GHz). As a result, cascading multiple such stages back-to-back provides diminishing return after two such stages, in one example.

In one example, since fanout is reduced without inductor usage, more such inductor-less stages are used in the initial part of the distribution (as the initial part of the clock distribution generates most of the thermal noise induced jitter due to their small size, the amount of noise generation quickly explodes). In another example, since quadrature phases are present at the end of the clock distribution, four single-ended or two differential coils are used as opposed to two single-ended coils at the beginning of the distribution, where merely two (differential) phases are present.

In one example, merely two inductive stages are used post Quadrature generator (Quadgen) 401. In some embodiments, one inductive stage is used as the very first stage post PLL's VCO. This inductive stage uses higher fanout to reach higher buffer sizes in subsequent stages to reduce jitter generation. In some embodiments, a shunt-series stage is used inside Quadgen 401 to boost its range of operation. The rest of the stages (e.g., six) may not have inductors but lower fanouts are used to maintain clock swing, jitter amplification and jitter generation at acceptable levels.

One factor of consideration for the inductive clock buffer is that the value of the inductor depends on the amount of capacitive load present and driving strength at a given buffer stage. A 2× increase in buffer size at iso fanout (FO) typically means approximately 0.5× the inductance. This means that at the very first stage, a very high inductance value is used (e.g., approximately 600 pH) which typically means very poor self-resonance frequency. As a result, some embodiments use low Q (e.g., less than 2) inductors at this stage to reduce the self-capacitance of the inductor coil to an acceptable range. This is achieved through use of coil in medium thickness layer in series with coil in the thick metal layers. Towards the last two stages, medium Q inductors are used since L value drops (self-capacitance drops as well). This medium Q usage also enables the use of higher fanout (e.g., greater than 3) to reduce power.

The very last stage, owing to its largest buffer size may use the least amount of inductance while at the same time consumes the largest amount of power. As a result, a series-shunt stage is well-suited as the last stage in the distribution. As mentioned herein, about 50% higher inductance value is acceptable since the inductance requirement is small while at the same time, the 20% power advantage leads to significant overall power saving.

Figure 5:
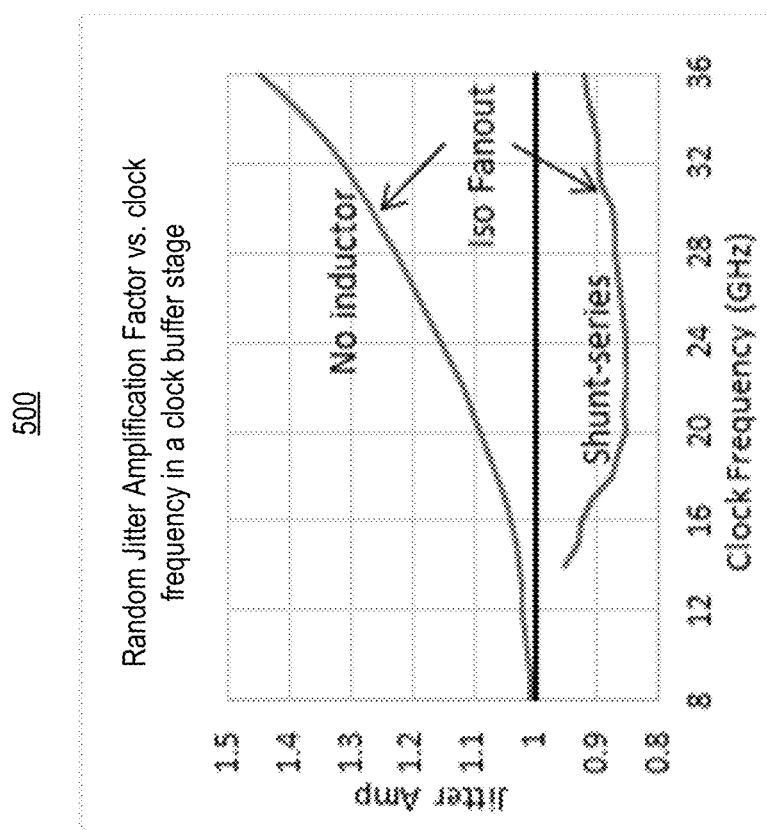
FIG. 5 illustrates a plot showing random jitter attenuation vs. clock frequency in a clock buffer stage, in accordance with some embodiments.

FIG. 5 illustrates plot 500 showing random jitter attenuation vs. clock frequency in a clock buffer stage. Plot 500 shows random jitter attenuation provided by one shunt-series inductively peaked CMOS clock buffer stage (series-shunt provides similar attenuation).

Figure 6:
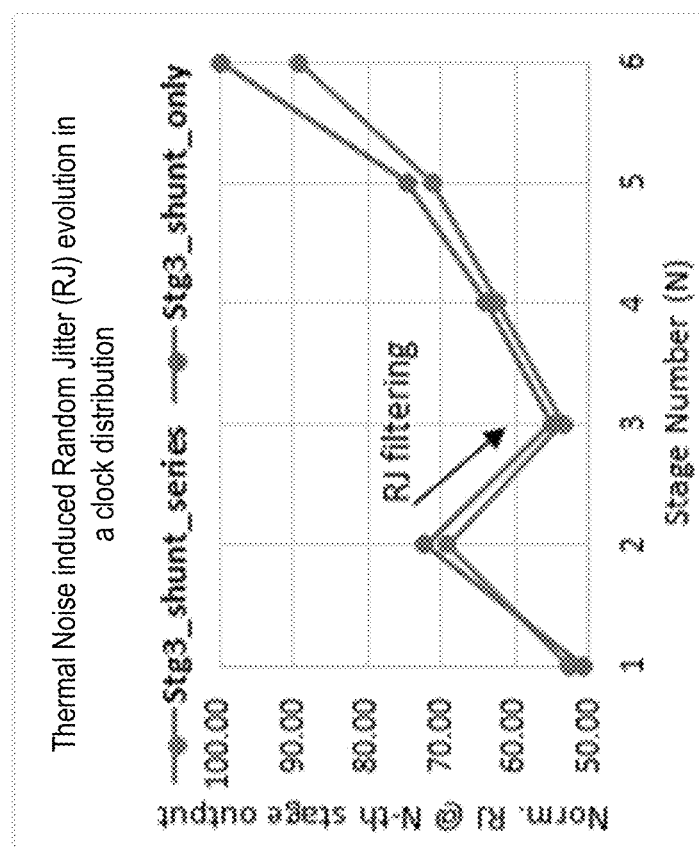
FIG. 6 illustrates a plot showing effect of an inductive stage to thermal noise induced random jitter in a clock distribution, in accordance with some embodiments.

FIG. 6 illustrates plot 600 showing the effects of an inductive stage to thermal noise inducted random jitter in a clock distribution, respectively, in accordance with some embodiments. Plot 600 shows the effect of adding one inductive stage (stage 3) in an otherwise inductor-less CMOS clock distribution. Shunt-series stage provides superior RJ filtering effect and picks up lower self-noise due to its higher swing compared to shunt only clock buffer.

Figure 7:
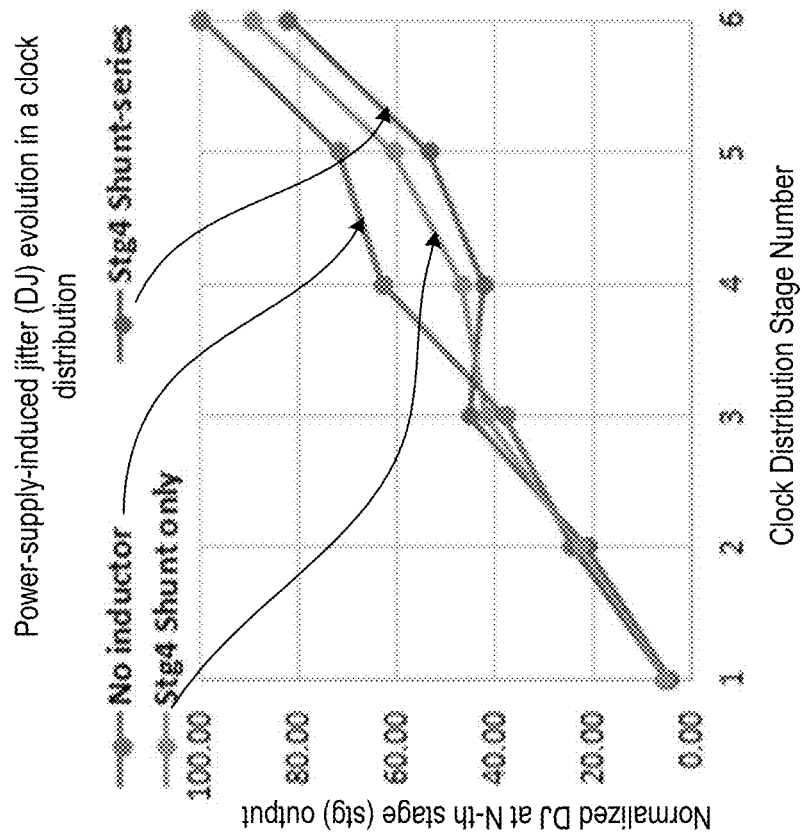
FIG. 7 illustrates a plot showing power supply induced jitter in a clock distribution, in accordance with some embodiments.

FIG. 7 illustrates plot 700 showing power supply induced jitter in a clock distribution, in accordance with some embodiments. Plot 700 shows the effect of adding one inductive stage (stage 4) in an otherwise inductor-less CMOS clock distribution. Shunt-series stage provides superior power-supply-induced deterministic jitter (DJ) when mixed with other inductor-less stages due to its positive sign for $\Delta$delay/$\Delta$Vcc as illustrated by Table 1.

TABLE 1

Underlying reason for DJ cancellation by a shunt-series inductive clock buffer stage

| | No inductor | Shunt Only | Shunt-series |
| --- | --- | --- | --- |
| Norm. $\Delta$delay/$\Delta$Vcc | −1 | −0.2 | +0.3 (sign change) |

A positive change in Vcc provides a positive change in delay of a shunt-series stage unlike shunt-only and inductor-less clock buffer stages. As a result, power supply induced deterministic jitter (DJ) in shunt-series stage has the opposite polarity to shunt-only and inductor-less stages. This provides DJ cancellation effect and overall superior DJ when one (or more) stages of an otherwise inductor-less traditional CMOS clock distribution is converted to a shunt-series stage.

Figure 8:
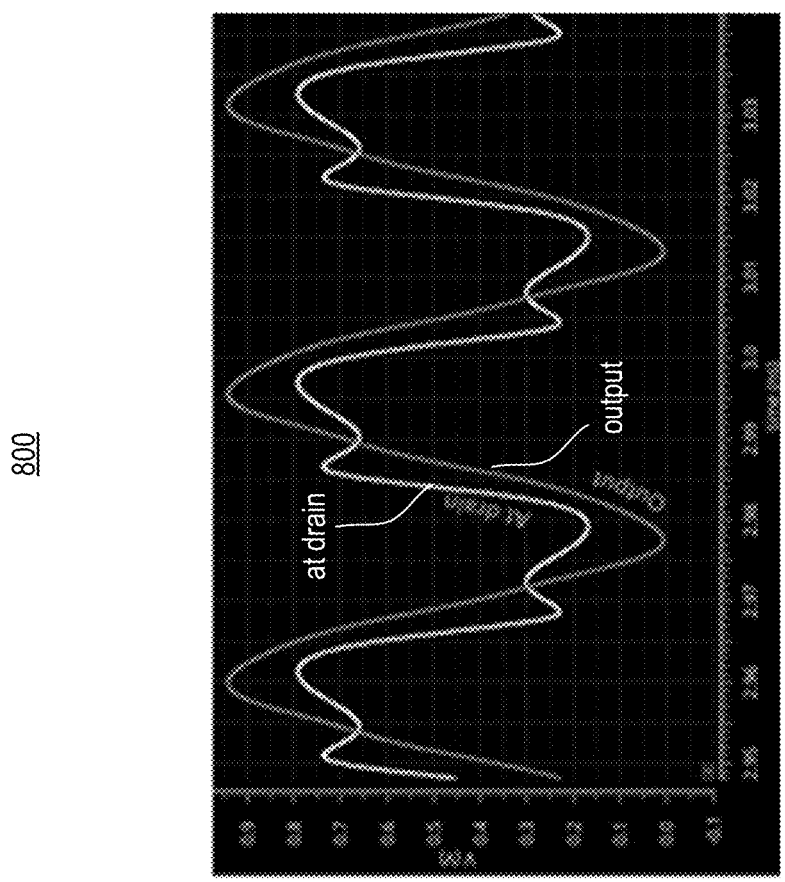
FIG. 8 illustrates a plot showing simulated waveforms of shunt-series peaked inductive CMOS clock buffer, in accordance with some embodiments.

FIG. 8 illustrates plot 800 showing simulation of shunt-series peaked inductive CMOS clock buffer, in accordance with some embodiments. Here, the lower swing at drain provides aging and reliability advantage without sacrificing final output swing.

Figure 9:
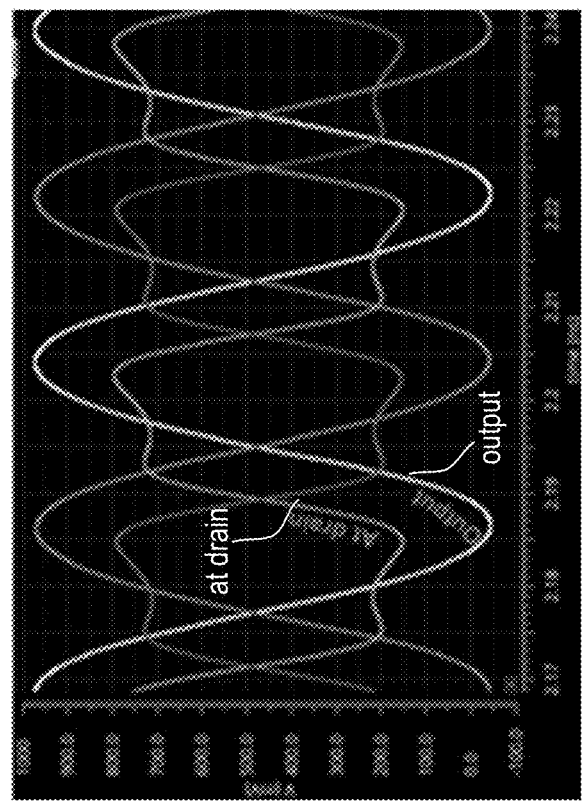
FIG. 9 illustrates a plot showing simulated waveforms of series-shunt peaked inductive CMOS clock buffer, in accordance with some embodiments.

FIG. 9 illustrates plot 900 showing simulation of series-shunt peaked inductive CMOS clock buffer, in accordance with some embodiments. The waveforms of shunt-series and series-shunt inductive stages are shown in FIGS. 8-9. Since the swing at the drain node is much less than Vcc, these two topologies (of FIGS. 3A-B) provide superior aging and reliability performance compared to shunt-only or inductor less topologies.

Table 2 provides comparison summary for different CMOS clock buffer stages.

TABLE 2

| Characteristic @28 GHz | No inductor | Shunt | Series | Various embodiments | | Comment |
| --- | --- | --- | --- | --- | --- | --- |
| | | | | Shunt-series | Series-shunt | |
| Random Jitter amplification @iso-fanout | >1 Poorest | <1 but next stage suffers in JA & self-noise due to lower swing | >1 | <1 | <1 | A few S-S stages bring down the overall RJ of the SerDes TX |
| $\Delta$delay/$\Delta$Vcc (DJ benefit) | −ve | −ve | −ve | +ve | +ve | S-S stages cancel power supply induced DJ coming from other non-inductive stages of the distribution |
| Average Current | | Similar | | | ~20% lower than others | Series-shunt is most beneficial in the last stage which typically consumes most power |

TABLE 2-continued

| Characteristic @28 GHz | No inductor | Shunt | Series | Various embodiments Shunt-series | Series-shunt | Comment |
|---|---|---|---|---|---|---|
| Aging and reliability | Worst due to high rms current | Good due to low rms current from inductor driven current cycling | Good due to low rms current from inductor driven current cycling | Good due to low rms current from inductor driven current cycling | Good due to low rms current from inductor driven current cycling | A series inductor provides lower swing at drain & helps with transistor aging and reliability |
| Inductor Size @iso-device size and iso-fanout (inductor since it has the size scales with buffer size) | N/A | ~1.2X | ~1X | ~1.3X | ~1.8X | Series-shunt inductor size is manageable at the last stage largest buffer size |

Figure 10:
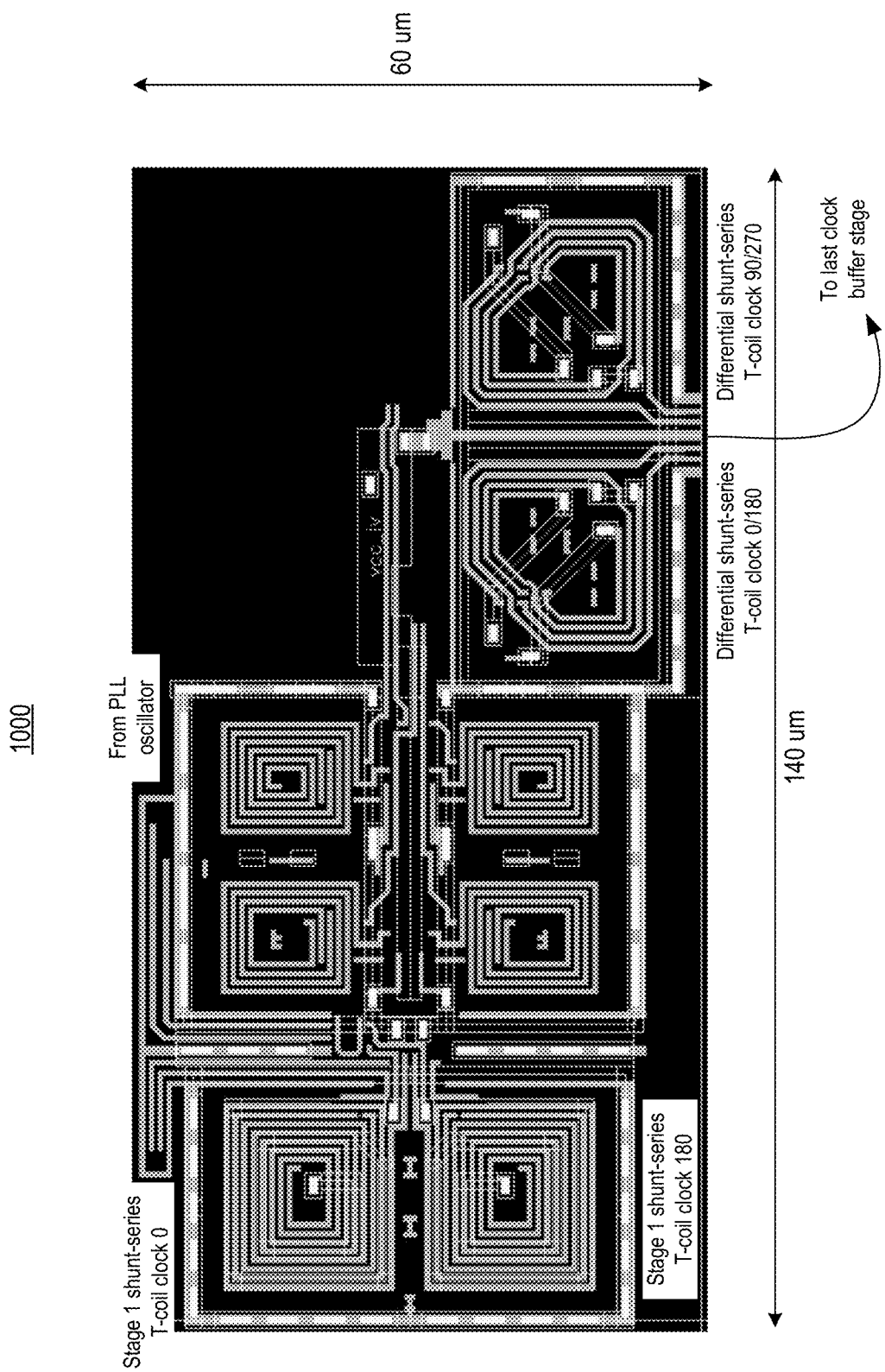
FIG. 10 illustrates a floorplan of a high-speed clock distribution except the last clock buffer stage, in accordance with some embodiments.
Figure 11:
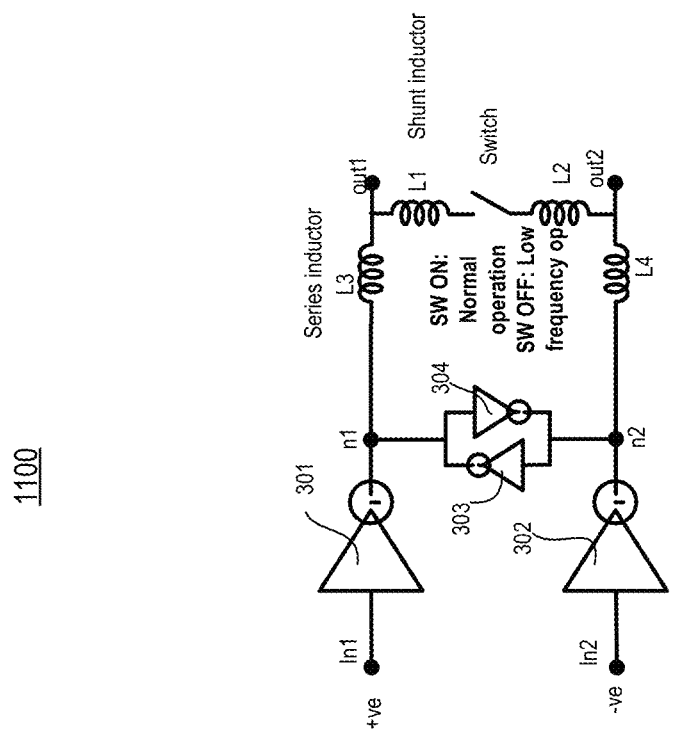
FIG. 11 illustrates a floorplan of the last clock buffer stage of the SerDes Tx, in accordance with some embodiments.
Figure 11:
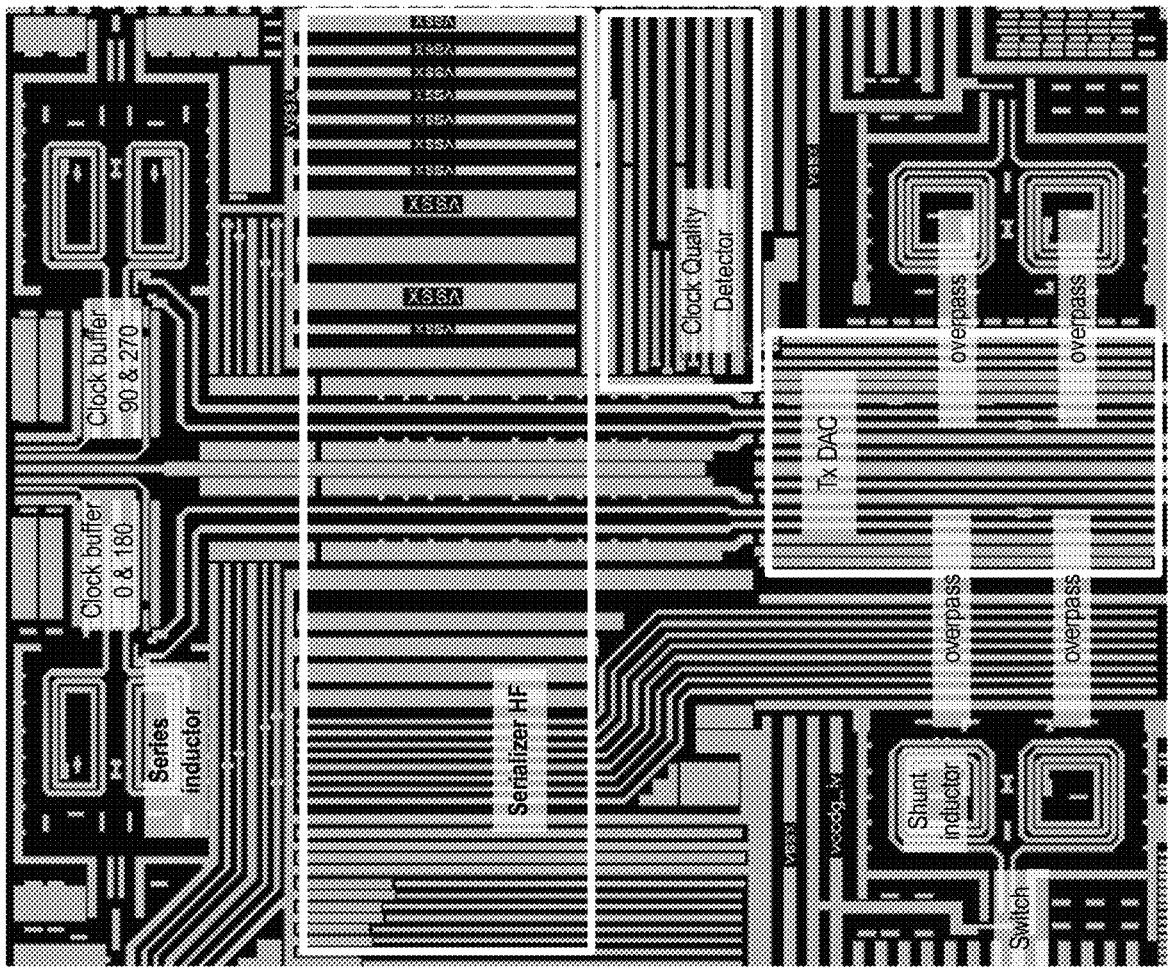
Figure 25:
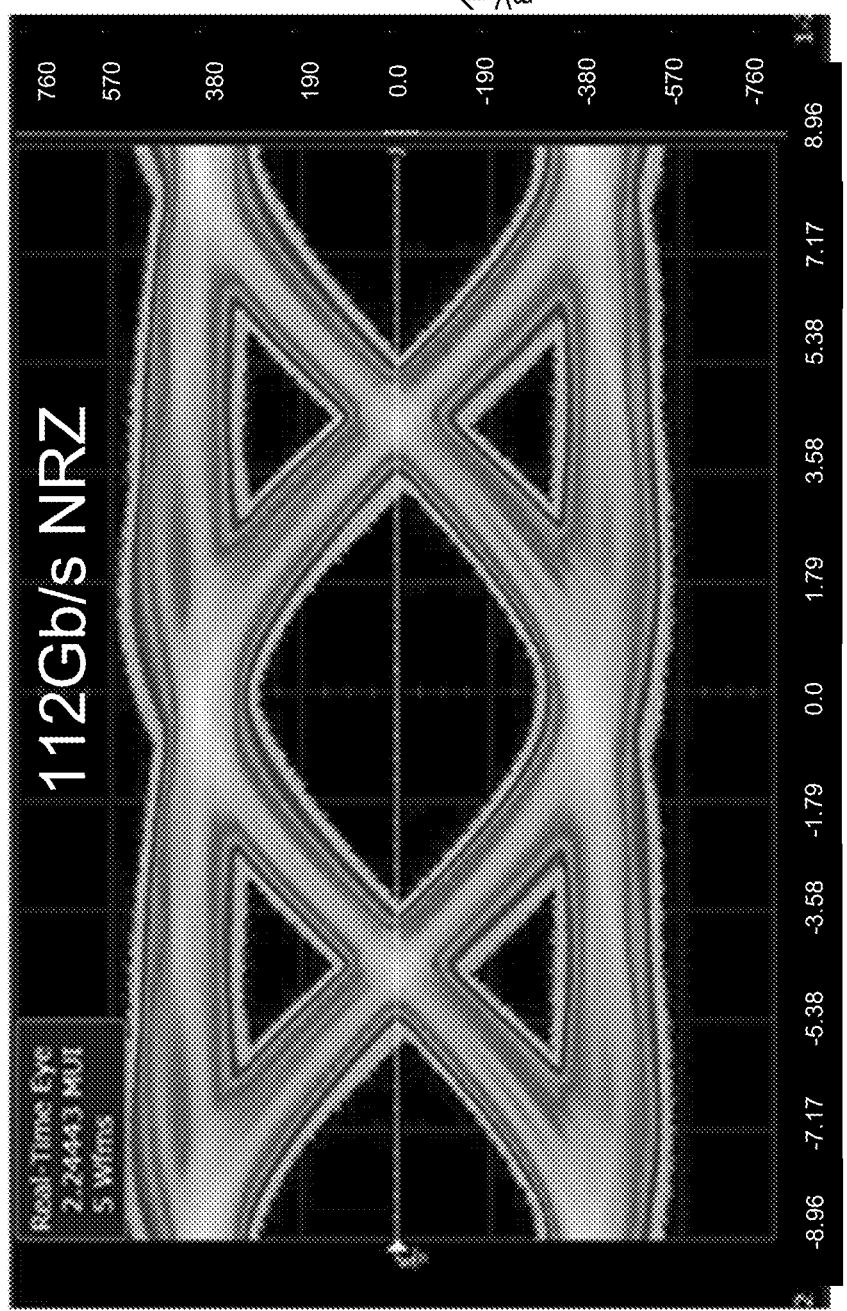
FIG. 25 illustrates an eye diagram of a full-rate 112 Gb/s PRBS-13 NRZ of SerDes Tx using the shunt-series Mux and/or inductor-based differential DeMux, in accordance with some embodiments.
Figure 26:
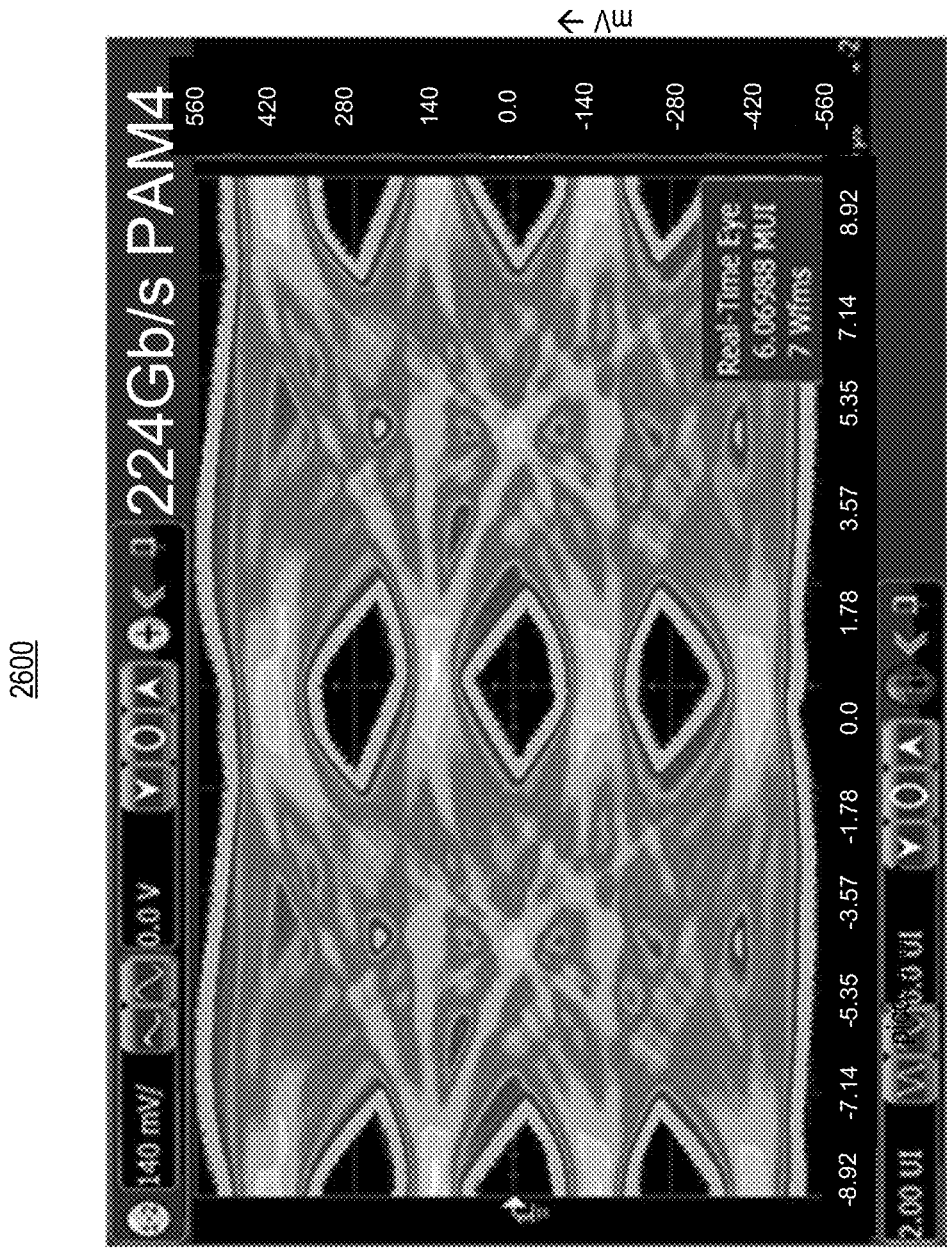
FIG. 26 illustrates an eye diagram of a full-rate 224 Gb/s PRBS-13 PAM-4 of SerDes Tx using the shunt-series Mux and/or inductor-based differential DeMux, in accordance with some embodiments.

In one example, the clock buffers meet jitter and amplitude specifications at 224 G-PAM4 with a 28 GHz on-die clock distribution. The clock buffers of various embodiments enable 224 Gb/s operation achieving excellent, "best-in-class" jitter numbers (e.g., less than 70 fs RJ, and less than 300 fs DJ) in lab measurement while consuming 0.6 pJ/bit clock distribution power (e.g., total 1.5 pJ/bit for the entire 224 Gb/s TX). Note, the Specification is RJ<=90 fs_rms and DJ<=385 fs_pp. The measured Tx eye diagrams are shown in FIGS. 25-26. FIGS. 10-11 show the floorplan over the clock distribution showcasing its compact implementation.

FIG. 10 illustrates floorplan 1000 of a high-speed clock distribution except the last clock buffer stage, in accordance with some embodiments.

FIG. 11 illustrates floorplan 1100 of the last clock buffer stage of the SerDes Tx, in accordance with some embodiments.

The following section describes asymmetric multiplexer (Mux) and de-multiplexer (DeMux) for multi data-rate support in ultra-low jitter SerDes TX (e.g., nominally operating at a rate of 224 Gb/s but can go from few Gb/s to up to 256 Gb/s).

Figure 12:
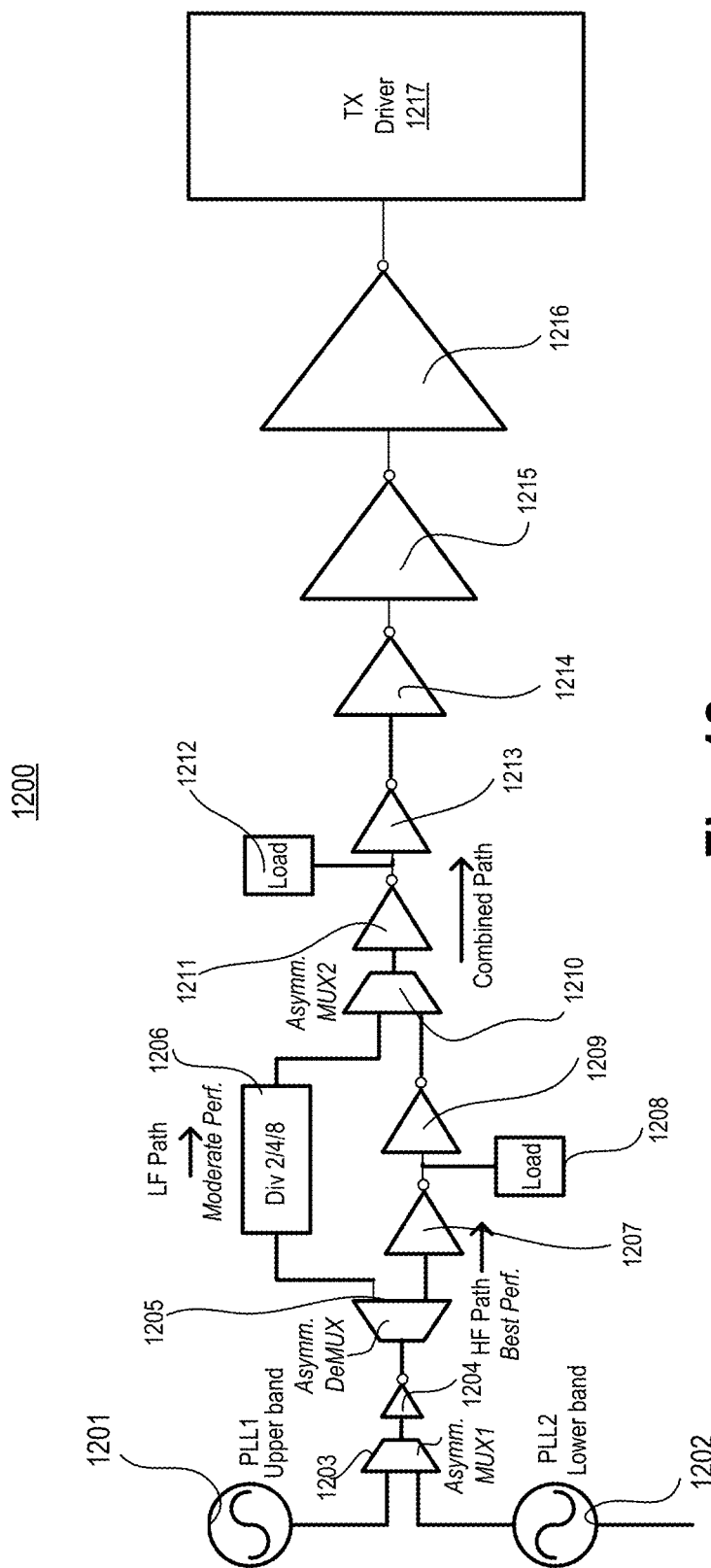
FIG. 12 illustrates a clock distribution for SerDes Tx with multiple multiplexers (Mux), and demultiplexer (DeMux), in accordance with some embodiments.

FIG. 12 illustrates clock distribution 1200 for multi-rate SerDes Tx with different multiplexers (MUX), and demultiplexer (DeMUX), in accordance with some embodiments. Clock distribution 1200 also shows why MUX/DeMUX and, in particular, why Asymmetric MUX/DeMUX are used in clock distribution of SerDes TX. Clock distribution 1200 comprises of PLL1 1201 to provide a first clock (upper band), PLL2 1202 to provide a second clock (lower band), a first asymmetric multiplexer 1203 (Asymm. Mux) inverter 1204, asymmetric de-multiplexer (Asymm. DeMux) 1205, divider 1206, inverter 1207, load 1208, inverter 1209, second asymmetric multiplexer (Asymm. Mux2), inverter 1211, load 1212, inverter 1213, inverter 1214, inverter 1215, inverter 1216, and receiver 1217 (e.g, a TX Driver) coupled as shown.

Here multiple phase locked loops (PLLs) 1201 and 1202 and divided clock paths (e.g., through divider 1206) are used to support a continuous, hole free clock frequency span. As a result, multiple multiplexers (Mux) 1203 and 1210 and at least one Demultiplexer (DeMux) 1205 are used to propagate either the full-rate clock or a programmable, divided version. In some embodiments, asymmetric DeMux 1205 sends the incoming clock to either the high-frequency (HF) path (that offers the highest performance) or the low-frequency (LF) path (that offers the lower performance needed by lower data-rate). In some embodiments, divider(s) 1206 (e.g., divide by 2, divide by 4, divide by 8) are disabled when the HF path is enabled.

Traditional Mux and DeMux are performance bottlenecks at high frequencies such as 28 GHz, meaning that the low-frequency requirements degrade the highest-frequency clock quality. Traditional Mux and DeMux suffer from significantly more random jitter issues than their inverter counterparts due to presence of series switches which lowers the fanout and generates more thermal noise and amplifies more of the incoming jitter compared to a traditional inverter-based clock buffer stage. Note that the highest frequency clock (e.g., 28 GHz) also desires the lowest jitter as TX jitter budget gets more stringent with a small 1-UI duration. Lower clock frequencies can tolerate more jitter as TX jitter budget gets relaxed.

Some embodiments take advantage of the inherent asymmetric requirements of clock distribution Muxs 1203 and 1210 and DeMux 1205 by (1) using inductors in shunt or in shunt-series configurations, and (2) using capacitively coupled tri-stateable inverter-based buffer stages. By using these two techniques, the circuits of various embodiments improve the jitter performance of the preferential path. As a result, the circuits of various embodiments enable 224 G-PAM4 operation achieving best in class jitter numbers. By using these two techniques along with the ability to "hide" the load of a non-preferred path at a virtual ground node of the shunt inductor, circuits of various embodiments improve the jitter and power consumption of the preferred path significantly.

Figure 13:
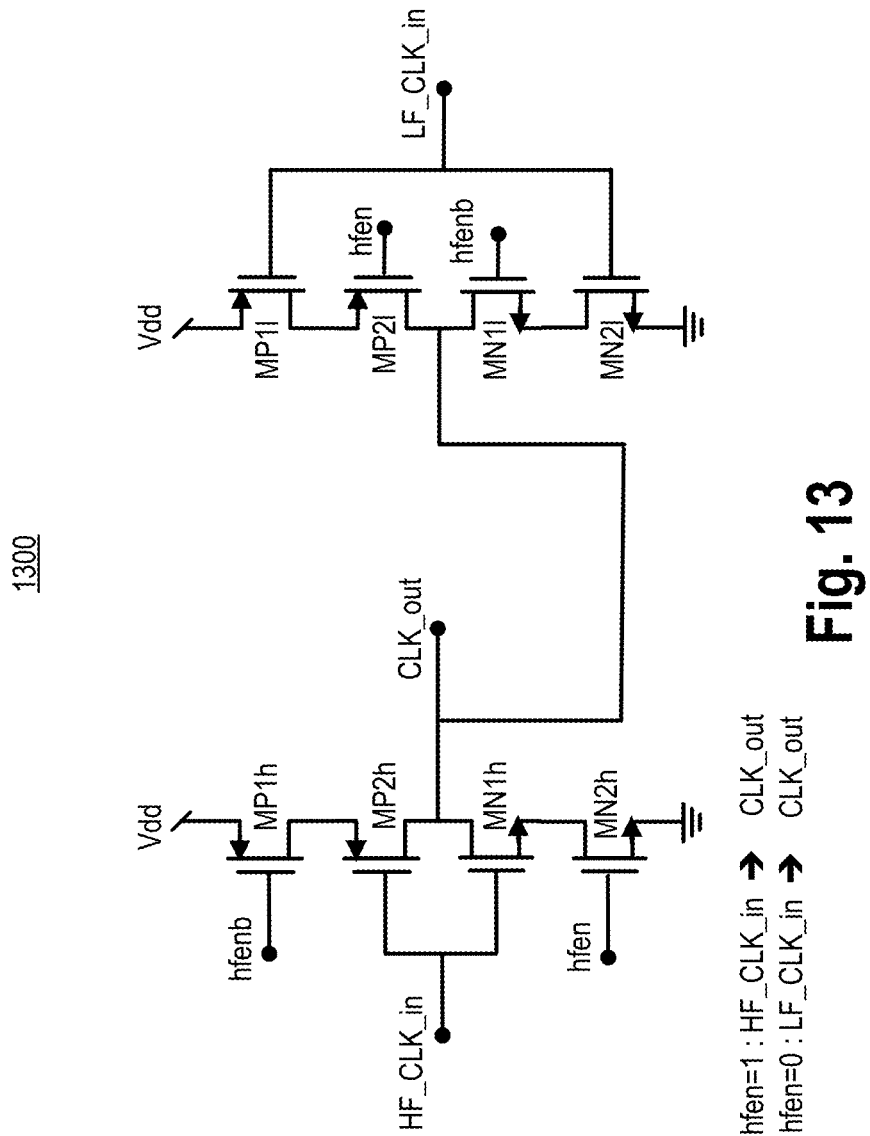
FIG. 13 illustrates a Mux with preferential treatment for high frequency (HF) path.

FIG. 13 illustrates multiplexer 1300 with preferential treatment for high frequency (HF) path compared to low frequency (LF) path. Mux 1300 comprises two tri-state drivers (e.g., inverters), one driven by a high-frequency clock (HF_CLK_in) and another driven by a low-frequency clock (LF_CLK_in). The tri-state inverter driven by HF_CLK_in comprises p-type transistors MP1h, MP2h, n-type transistors MN1h and MN2h coupled as shown and controllable by high frequency enable (hfen) and its inverse (hfenb). The tri-state inverter driven by LF_CLK_in comprises p-type transistors MP11, MP21, n-type transistors MN11 and MN21 coupled as shown and controllable by enable (hfen) and its inverse (hfenb). Mux 1300 preferentially treats the HF path over the LF path by putting the enable switches of the LF path closer to the output which effectively shields its internal node capacitances from the final output, Clk_out. In various embodiments, when hfen is 1, high frequency clock HF_CLK_in is provided to CK_out. In some embodiments, when hfen is 0, low frequency clock LF_CLK_in is provided to CLK_out.

Figure 14:
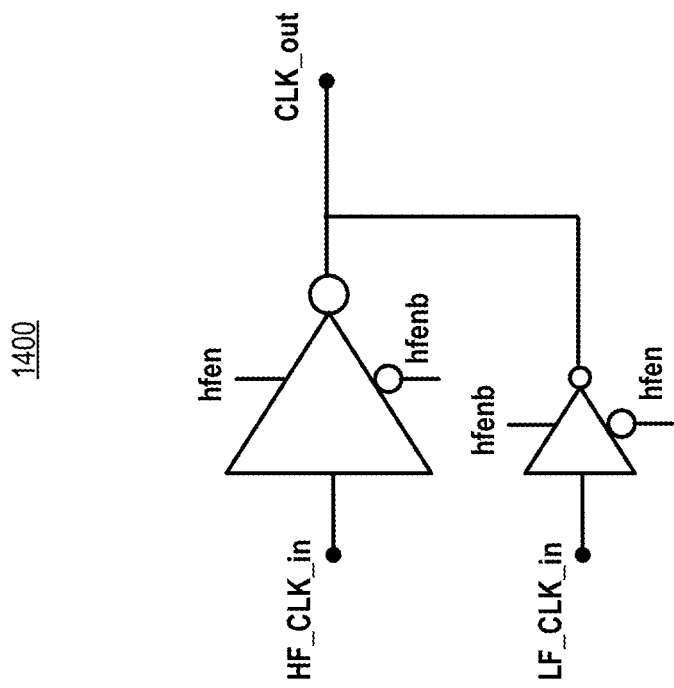
FIG. 14 illustrates a symbolic view of the Mux showing size and fanout difference between the two paths to improve fanout seen by the HF path.

FIG. 14 illustrates symbolic view 1400 of the multiplexer (Mux) showing size and fanout difference between the two paths to improve fanout seen by the HF path. Symbolic view 1400 reduces the size of the LF path buffer to improve the fanout of the HF path. Depending on a technology node, solutions of FIG. 13 and FIG. 14 work at 14-16 GHz clock frequency range. However, these solutions suffer from very high jitter amplification at 28 GHz for iso fanout. One way to meet performance at 28 GHz by these traditional Muxes is to lower the fanout substantially to even less than 1 to provide sufficiently high bandwidth (BW), in accordance with some embodiments. This approach brings the overall power consumption of the clock distribution significantly high.

Figure 15:
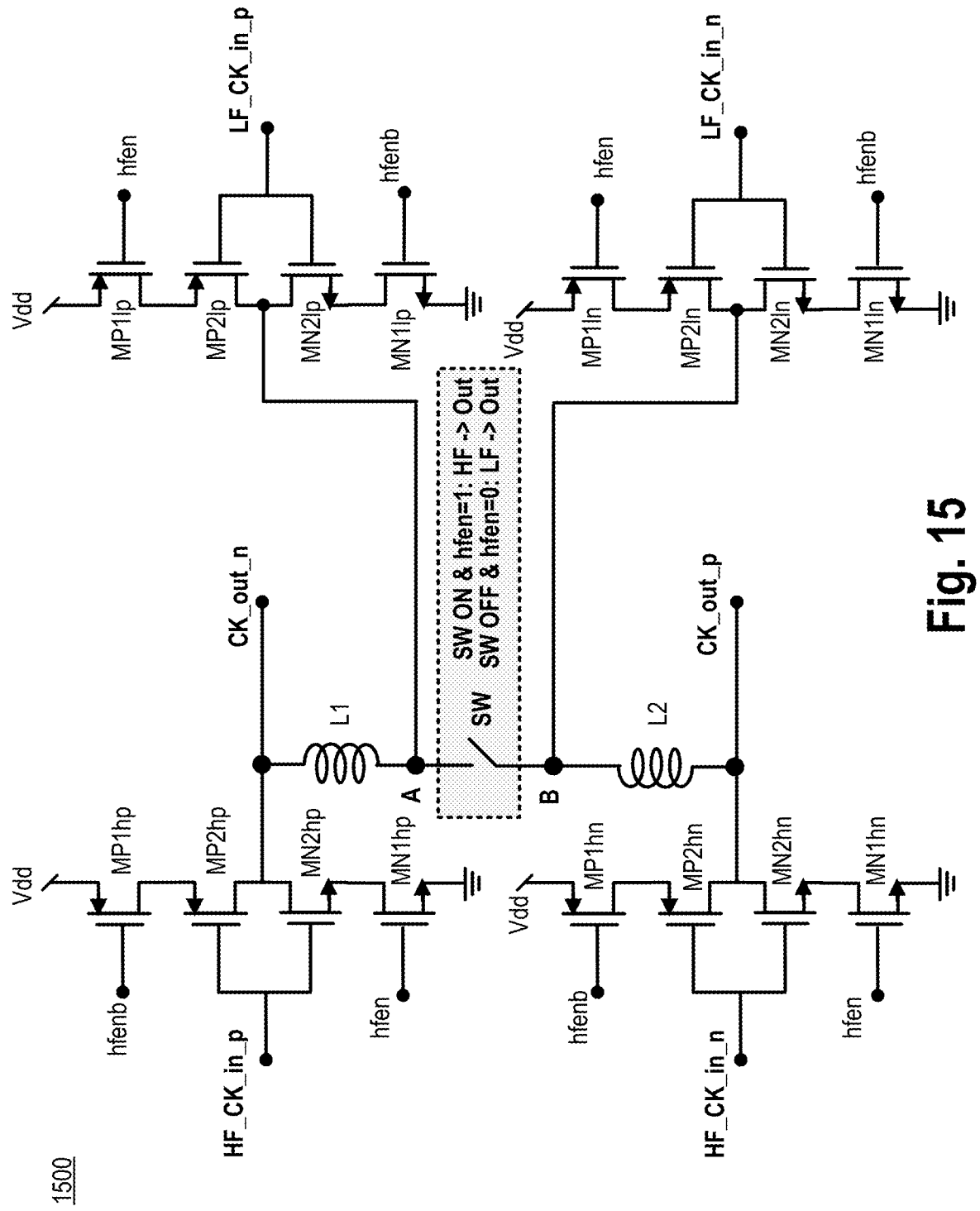
FIG. 15 illustrates a shunt inductor-based asymmetric Mux with tri-stateable inverters, in accordance with some embodiments.

FIG. 15 illustrates a shunt inductor-based asymmetric multiplexer (Mux) 1500 (e.g., 1203 and/or 1210) with tri-stateable drivers (e.g., inverters), in accordance with some embodiments. Mux 1500 comprises four tri-stateable drivers (e.g., inverters) forming an asymmetric Mux. The asymmetry is to provide preference to the HF path compared to the LF path. The first tri-state inverter comprises p-type transistors MP1$hp$, MP2$hp$, and n-type transistors MN2$hp$ and MN1$hp$ coupled in series. The first tri-state inverter is driven by HF_CLK_in_p and controlled by hfen and hfenb. The second tri-state inverter comprises p-type transistors MP1$hn$, MP2$hn$, and n-type transistors MN2$hn$ and MN1$hn$ coupled in series. The second tri-state inverter is driven by HF_CLK_in_n and controlled by hfen and hfenb, where HF_CLK_in_p is complementary of HF_CLK_in_n. The third tri-state inverter comprises p-type transistors MP1$lp$, MP2$lp$, and n-type transistors MN2$lp$ and MN1$lp$ coupled in series. The third tri-state inverter is driven by LF_CLK_in_p and controlled by hfen and hfenb. The fourth tri-state inverter comprises p-type transistors MP1$ln$, MP2$ln$, and n-type transistors MN2$ln$ and MN1$ln$ coupled in series. The fourth tri-state inverter is driven by LF_CLK_in_n and controlled by hfen and hfenb, where LF_CLK_in_p is complementary of LF_CLK_in_n.

In various embodiments, inductor L1 is connected between the output (Clk_out_n) of the first tri-state inverter and the output 'A' of the third tri-state inverter. In some embodiments, inductor L2 is connected between the output CK_out_p of the second tri-state inverter and the output 'B' of the fourth tri-state inverter. In some embodiments, output nodes 'A' and 'B' are connected by a switch (e.g., one or more transistors) controllable by SW.

Mux 1500 uses an inductor which acts as a shunt inductor during HF→Out mode of operation (SW in ON and the HF inv is enabled, LF inv is disabled). This shunt inductor provides random jitter filtering during HF operation. In addition to that, since nodes A and B are virtual ground (assuming sufficiently low switch resistance which is ensured by design), the capacitance of the LF inverter (third and/or fourth tri-state inverters) is not "seen" during HF operation. This improves the effective Fanout during HF operation. The jitter filtering by the shunt inductor and lowered effective fanout provide about 2× benefit in jitter amplification at iso-fanout compared to a conventional Mux.

During the LF→Out mode of operation (SW in OFF and the HF inverter is disabled, LF inverter is enabled), the inductor now appears in series path and provides a peaked response by resonating a portion of the total load. As a result, even this mode operation provides superior jitter performance compared to a conventional Mux. While the embodiments illustrate a differential multiplexer, the same concepts are applicable to a single-ended multiplexer. In a single-ended Mux, one side of the switch (e.g. node B) is connected to a common-mode DC voltage (typically half of the supply voltage Vdd) according to some embodiments. This DC voltage provides an AC ground at node B thus also 'hides' the load of the LF inv when HF path is operational. In various embodiments, When switch is ON and hfen=1, the high-frequency clock HF_CK_in_p is provided to CK_out_n, and HP_CK_in_n is provided to CK_out_p. In some embodiments, when SW is Off and hfen=0, the low-frequency clock is provided to the output. For example, LF_CK_in_p is provided to CK_out_n, and LF_CK_in_n is provided to CK_out_p.

Figure 16:
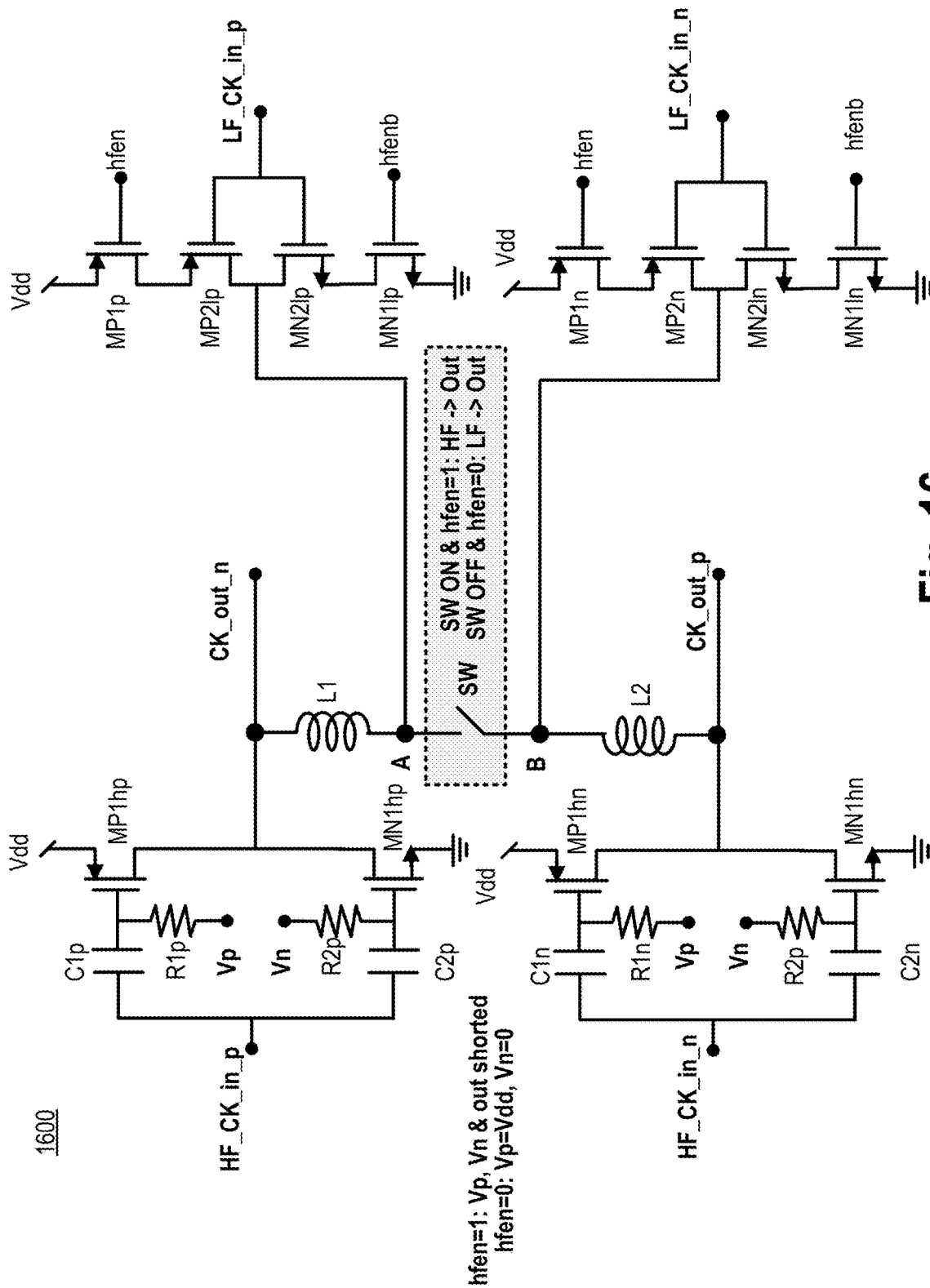
FIG. 16 illustrates a shunt inductor-based asymmetric Mux with capacitively coupled tri-stateable inverters, in accordance with some embodiments.

FIG. 16 illustrates a shunt inductor-based asymmetric multiplexer 1600 with capacitively coupled tri-stateable inverters, in accordance with some embodiments. In Mux 1600, the HF tri-state inverters (first and second tri-state inverters) are replaced with capacitively coupled tri-stateable inverters—first capacitively coupled tri-stateable inverter, and second capacitively coupled tri-stateable inverter.

In some embodiments, first capacitively coupled tri-stateable inverter comprises p-type transistor MP1$hp$ and n-type transistor MN1$hp$ coupled in series. The first capacitively coupled tri-stateable inverter further comprises capacitors C1$p$ and C2$p$, and resistors R1$p$ and R2$p$ coupled as shown. HF input HP_CK_in_p is received by the gates of MP1$hp$ and MN1$hp$ via capacitors C1$p$ and C2$p$, respectively. Nodes Vp and Vn coupled to resistors R1$p$ and R2$p$ are biased by any suitable bias generator.

In some embodiments, second capacitively coupled tri-stateable inverter comprises p-type transistor MP1$hn$ and n-type transistor MN1$hn$ coupled in series. The second capacitively coupled tri-stateable inverter further comprises capacitors C1$n$ and C2$n$, and resistors R1$n$ and R2$n$ coupled as shown. HF input HP_CK_in_n is received by the gates of MP1$hn$ and MN1$hn$ via capacitors C1$n$ and C2$n$, respectively. Nodes Vp and Vn coupled to resistors R1$n$ and R2$n$ are biased by any suitable bias generator. In various embodiments, the voltage of Vp node is higher than the voltage on the Vn node. In some embodiments, the voltage on the Vp node is positive while the voltage on the Vn node is negative. In some embodiments, the voltage on the Vp node and the voltage on the Vn node are both positive such that the voltage of Vp node is higher than the voltage on the Vn node. In some embodiments, when hfen is 1, Vp, Vn, and output of the capacitively coupled tri-stateable inverter are shorted. In some embodiments, when hfen is 0, Vp=Vdd, Vn=0. In some embodiments, when SW is on and hfen=1, high frequency clock (HF_CK_in_p and HF_CK_in_n) are provided as outputs on nodes CK_out_n and CK_out_p, respectively. In some embodiments, when SW is off and hfen=0, low frequency clock (LF_CK_in_p and LF_CK_in_n) are provided as outputs on codes CK_out_n and CK_out_p, respectively.

In some embodiments, Mux 1600 is an improved version of Mux 1500. The improvement comes from replacing the HF inverter from a tri-state series-switch based inverter to a capacitively coupled, series-switch-less, tri-stateable inverter. All else including the inductor connection remains the same as Mux 1500. While the embodiments illustrate a differential multiplexer, the same concepts are applicable to a single-ended multiplexer. In a single-ended Mux, one side of the switch (e.g. node B) is connected to a common-mode DC voltage (typically half of the supply voltage Vdd) according to some embodiments. This DC voltage provides an AC ground at node B thus also 'hides' the load of the LF inverter when the HF path is operational.

Figure 17:
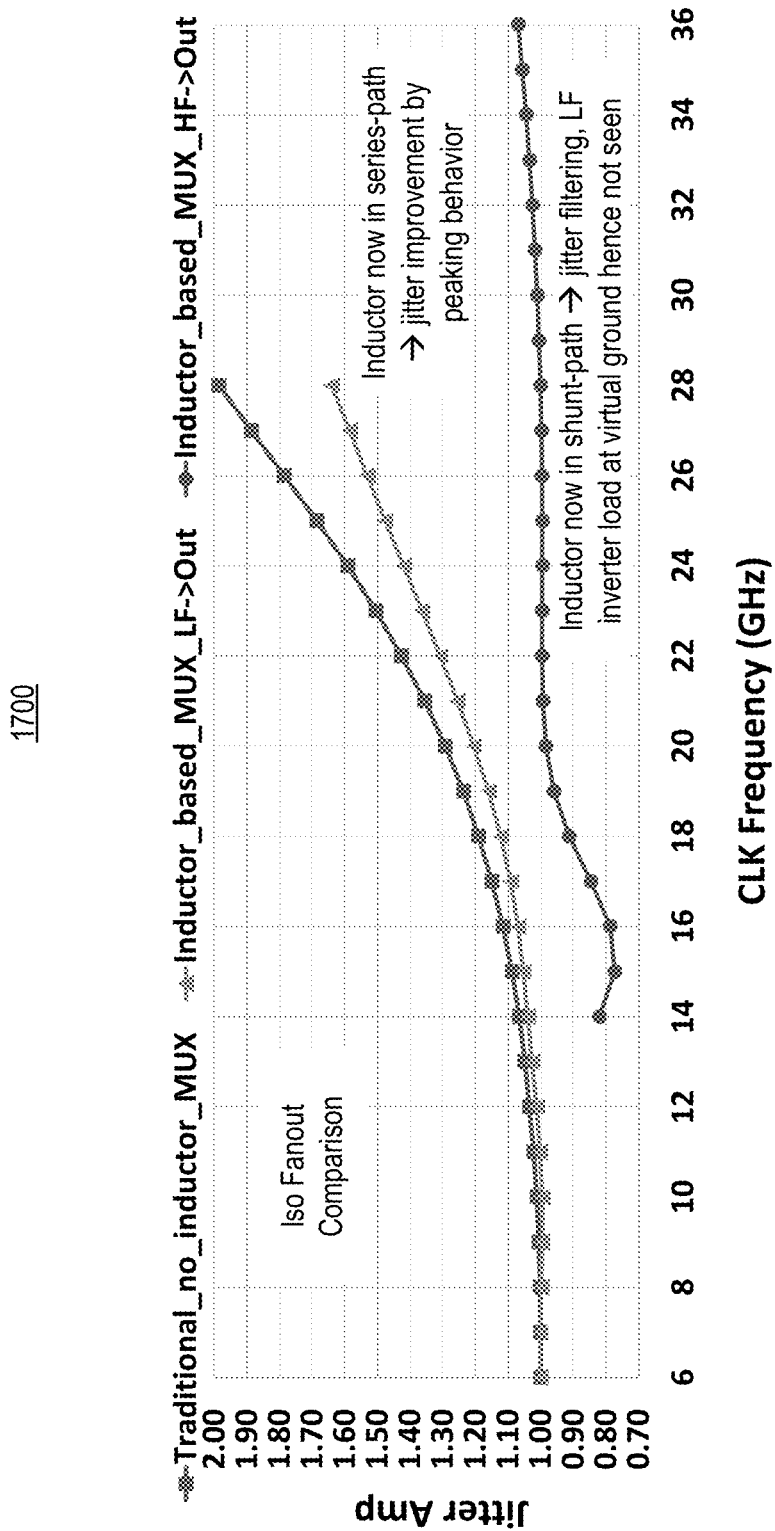
FIG. 17 illustrates a plot showing jitter performance of shunt inductor-based asymmetric Mux and Mux of FIG. 13, in accordance with some embodiments.

FIG. 17 illustrates plot 1700 showing jitter performance of shunt inductor-based asymmetric multiplexer of FIG. 15 and conventional/traditional multiplexer of FIG. 13, in accordance with some embodiments. In the HF path operation, the inductor in shunt path provides jitter filtering as well as hiding the loading of the LF path devices (since they are connected to the virtual ground node since the switch is ON). In the LF path operation, the inductor comes in series and provides superior performance than the traditional case due to peaking action provided by the series inductor in resonating a portion of the load capacitance.

Figure 18:
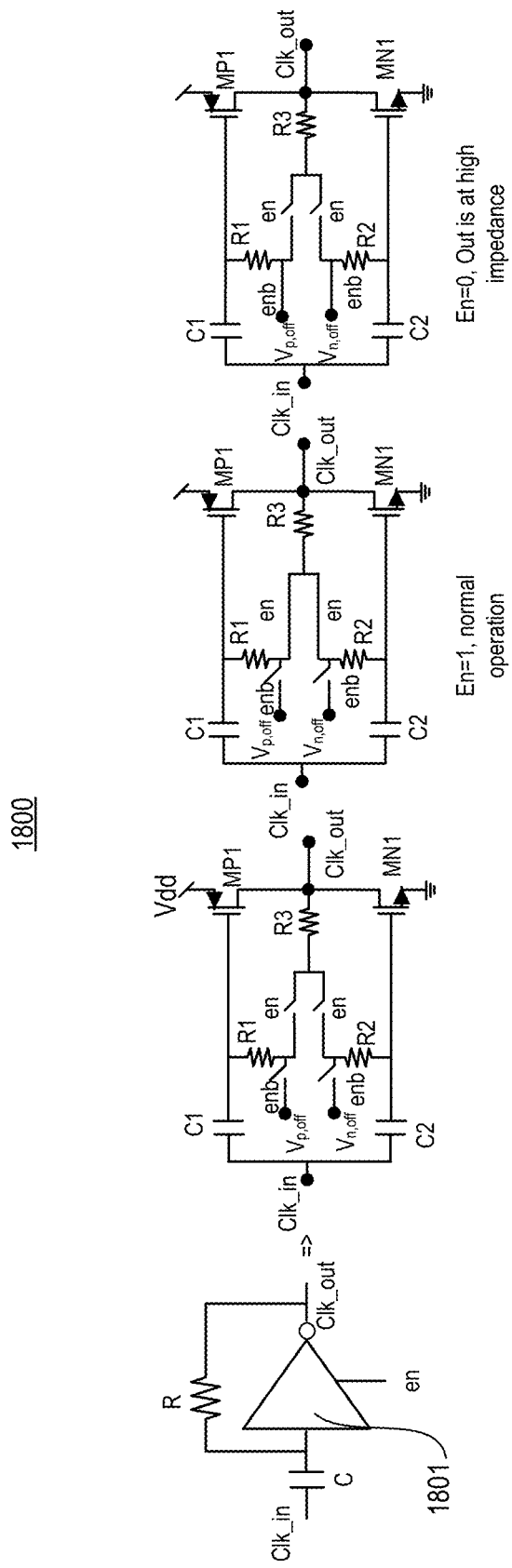
FIG. 18 illustrates a capacitively coupled tri-stateable inverter, in accordance with some embodiments.

FIG. 18 illustrates a capacitively coupled tri-stateable inverter circuitry 1800, in accordance with some embodiments. The symbolic view of inverter circuitry 1800 comprises inverter 1801 controllable by enable En, and having a feedback path via resistor R between the input (Clk_in) and output (Clk_out). A capacitor is coupled to the input Clk_in. Here, reference to nodes and signals are interchangeably used. For example, Clk_in may represent input clock signal or node Clk_in depending on the context of the sentence.

Inverter 1800 comprises p-type transistor MP1, n-type transistor MN1, resistors R1, R2, and R3, switches controllable by enable en and enb (inverse of en), nodes Vp,off and Vn,off, capacitors C1 and C2, input node Clk_in, and output node Clk_out coupled as shown.

When en=1, the resistors are placed in feedback which sets the correct bias voltage at the gates of MN1 and MP1. This is normal operation mode. When en=0, the feedback is broken and the gates of the MN1 and MP1 are tied to ground and Vcc, respectively, to make them both OFF. As a result, the output Clk_out becomes high impedance (third state of the tri-state). Note that in this high-impedance mode, if the incoming clock swing is high, some of this clock can still go to the output by turning on the transistors MN1 or MP1, periodically. In the SerDes TX clock distribution, this situation is precluded by designing the distribution correctly so that the HF clock is turned off earlier than the Mux stage.

Figure 19B:
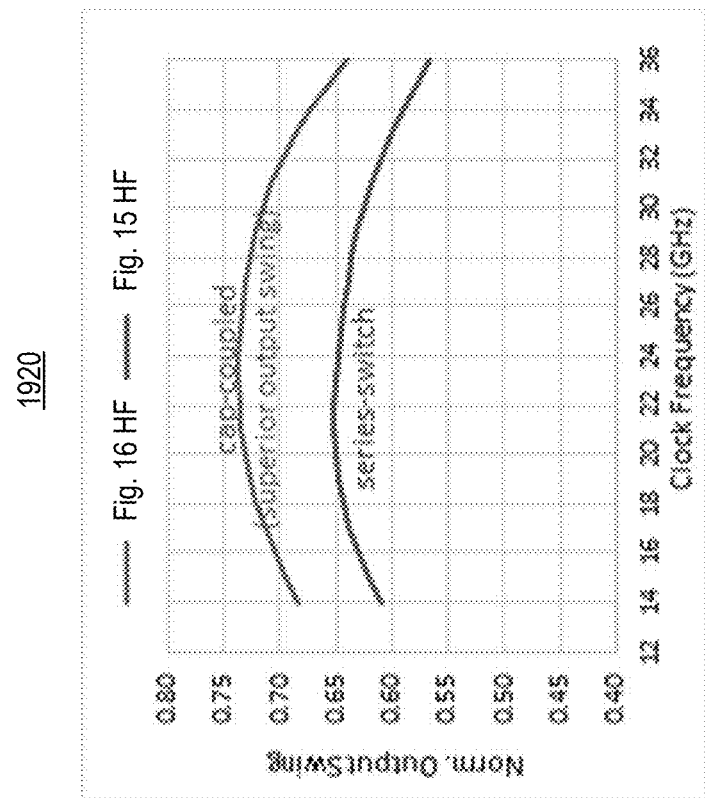
FIGS. 19A-B illustrate a set of plots showing jitter amplification performance for series switch in face of capacitive coupled for HF_Clk_in to output operation, and for clock swing at the Mux outputs, respectively, in accordance with some embodiments.
Figure 19A:
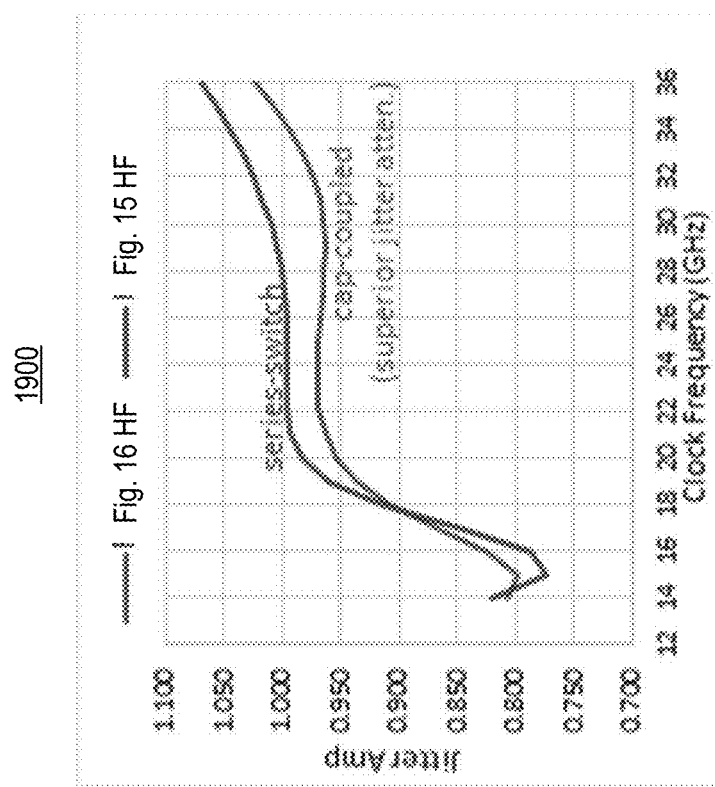

FIGS. 19A-B illustrate a set of plots 1900 and 1920, respectively, showing jitter amplification performance for series switch in the face of capacitive coupling for HF_Clk_in to output operation, and for clock swing at the multiplexer outputs, respectively, in accordance with some embodiments. Plots 1900 and 1902 show superior jitter amplification (attenuation) and larger swing by circuit of FIG. 16 than its series-switch based counterpart shown in FIG. 15. Additionally, or alternatively, the series switch generates more thermal noise and hence additional random jitter in addition to its worse jitter amplification. Plot 1900 shows superior jitter amplification performance of removing the series switch in favor of capacitive coupling for HF_clk_in to output operation.

Figure 20:
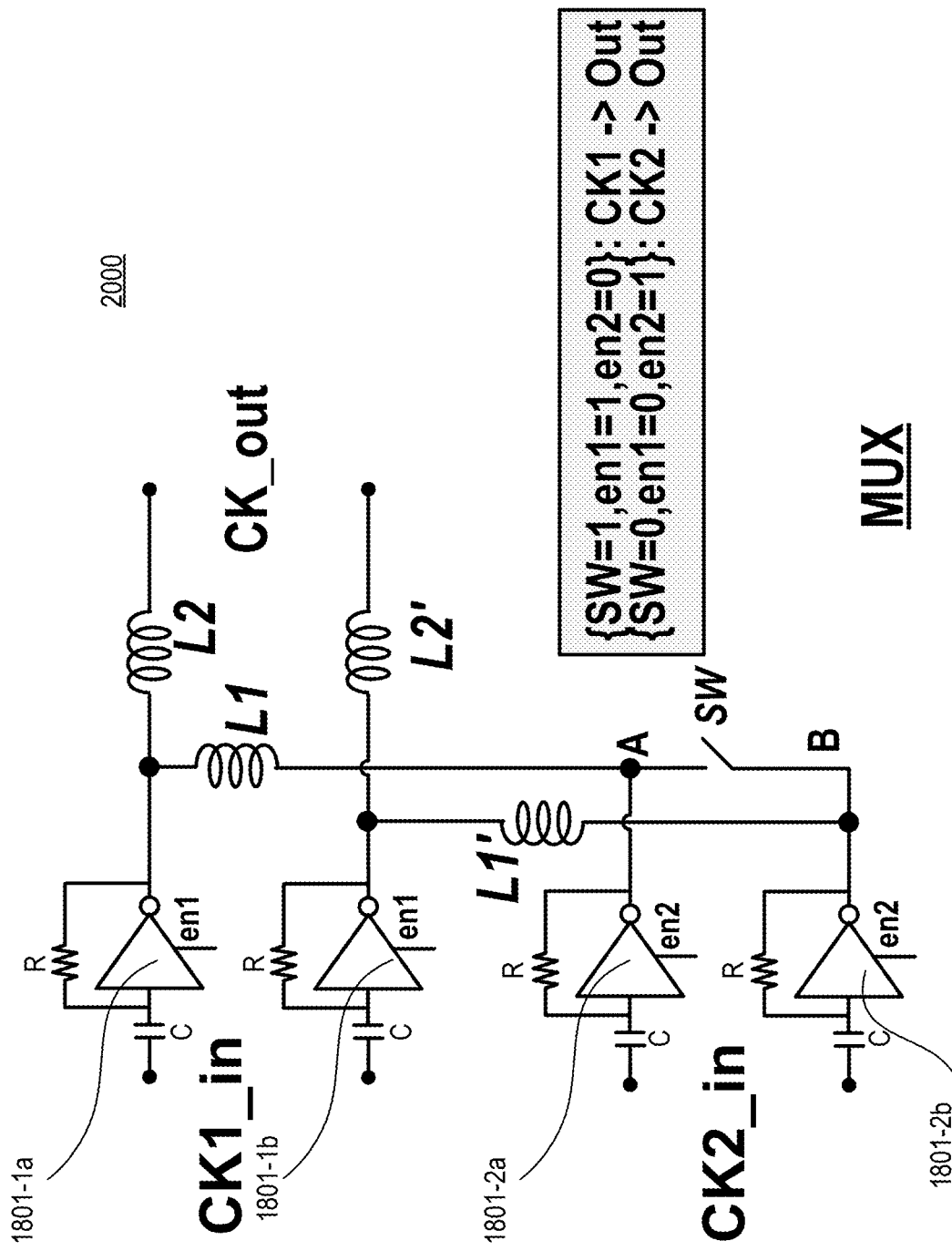
FIG. 20 illustrates a shunt-series Mux, in accordance with some embodiments.

FIG. 20 illustrates a shunt-series Asymmetric Mux 2000, in accordance with some embodiments. Shunt-series Mux 2000 comprises four capacitively coupled tri-stateable inverter circuitries 1800 (e.g., with inverters 1801-1a, 1801-1b, 1801-2a, 1802-2b) coupled to inductors L1, L1', L2, and L2' as shown. The additional inductor, L2, appears in the series path for the preferred path (e.g., HF path) operation (CK1→Out). This shunt-series configuration provides superior performance. Inductors L2 and L2' provide the benefit of series inductance. Mux 2000 is an improved version of Mux 1600. Note that, inductors L1 and L2 can be made into a single T-coil structure to save area according to some embodiments. One purpose of inductors L2 (or L2') is to boost the output swing the CK_out which improves jitter amplification and jitter generation at the next stage. In some embodiments, when the switch is enabled (turned on e.g., SW=1) and en1=1 and en2=0 are set for the capacitively coupled tri-stateable inverter circuitries, CK1 in is provided to CK_out. In some embodiments, when the switch is disabled (turned off e.g., SW=0) and en1=0 and en2=1 are set for the capacitively coupled tri-stateable inverter circuitries, CK2_in is provided to CK_out.

Figure 21:
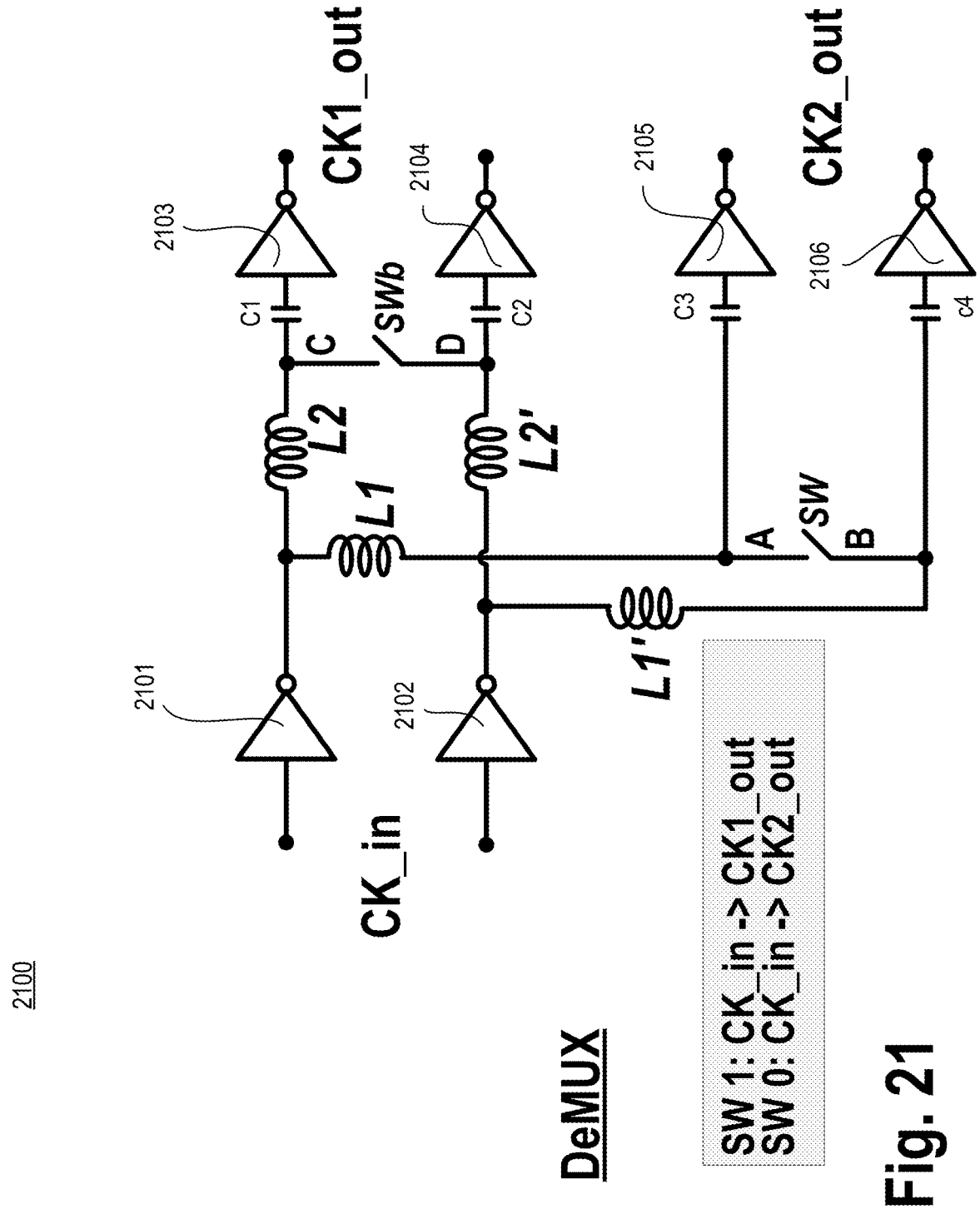
FIG. 21 illustrates an inductor-based differential DeMux utilizing two inductors and two switches, in accordance with some embodiments.

FIG. 21 illustrates an inductor-based differential DeMux 2100 utilizing two inductors and two switches, in accordance with some embodiments. DeMux 2100 comprises inverters 2101, 2102, 2103, 2104, 2105, and 2106, inductors L1, L1' L2, and L2', switch SW, switch SWb, capacitors C1, C2, C3, and C4 coupled as shown. Switch SW is between nodes A and B, while switch SWb is between nodes C and D. Note, the control of switch SWb is complementary to the control of switch SW. For example, is one switch is on (e.g., SW=1) then the other switch is off (e.g., SWb=0). In some embodiments, inductance of inductor L1 is greater than inductance of inductor L2. This input CK_in is a differential clock, and outputs CK1_out and CK2_out are differential outputs.

De_Mux 2100 uses the similar L1-L2 inductors and switch setup as in Mux 2000 with one additional switch between nodes C and D. During Ck→Out1 mode of operation (governed by the truth table in the figure) when CK_in is provided as CK1_out, L1 is in shunt and L2 is in series. Thus, the system provides jitter filtering by the shunt inductor and swing improvement by the series inductor. Additionally, the Out2 inverters 2105 and 2106 (i.e., inverter that generates CK2_out) in this mode are connected to the virtual ground A-B and hence not "seen" by CK_in→CK1_out in effective fanout calculation. During CK_in→Out2 mode of operation, the inductor system again works as shunt-series and everything works same as before (L2 comes in shunt and L1 comes in series). Due to symmetry, one might expect CK2_in→CK2_Out mode's performance to be the same as CK_in→CK1_out mode's performance. However, this is merely true if inductances L1 and L2 are substantially equal. But typically for best performance, inductor L1 is designed to be larger than inductor L2 which preferentially improves performance of CK_in→CK1_out mode at the cost of the other mode. When switch SW is closed (SW=1), then CK_in is provided to CK1_out. When switch SW is open (SW=0), then CK_in is provided to CK2_out.

Figure 22:
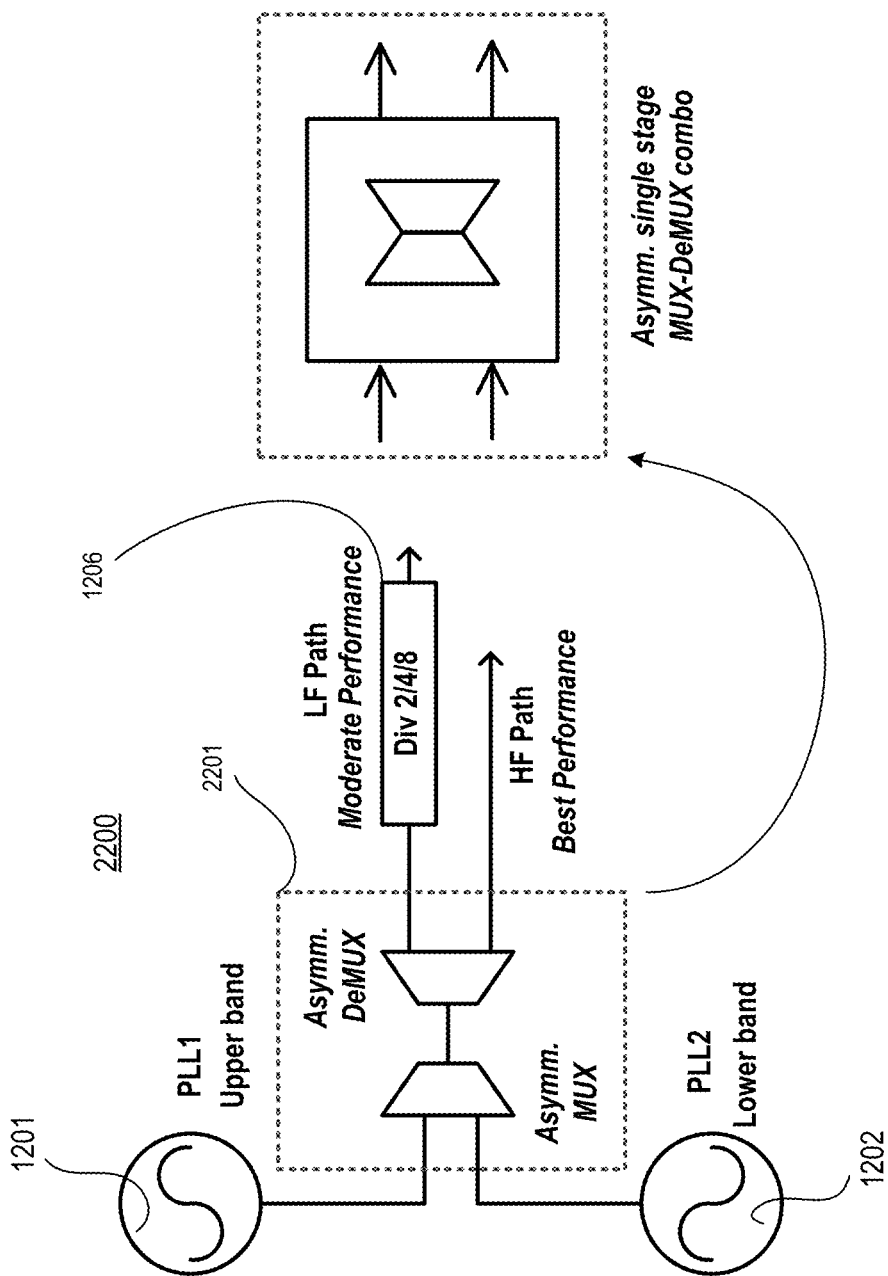
FIG. 22 illustrates an apparatus with combination of a shunt-series Mux and an inductor-based DeMux, in accordance with some embodiments.

FIG. 22 illustrates apparatus 2200 with combination of shunt-series Mux and inductor-based DeMux, in accordance with some embodiments. Apparatus 2200 comprises PLL1 1201, PLL2 1202, a combination of Asymm. Mux and Asymm. DeMux circuitry 2201, and divider 1206 as shown. Since the number of stages in a clock distribution is a costly parameter for a high frequency (e.g., 28 GHz) clock distribution and the fact that limited inductor area is available in silicon, some embodiments reuse or share the inductors particularly when the De-Mux usually follows the Mux in a SerDes clock distribution. This scenario is shown in FIG. 22. Here, inductors L1-L2 are reused. Combining Mux and DeMux as shown in circuitry 2201 is possible in SerDes clock distribution preserving preferential treatment from one of the inputs to one of the outputs. One such combined differential Mux-DeMux is illustrated in FIG. 23.

Figure 23:
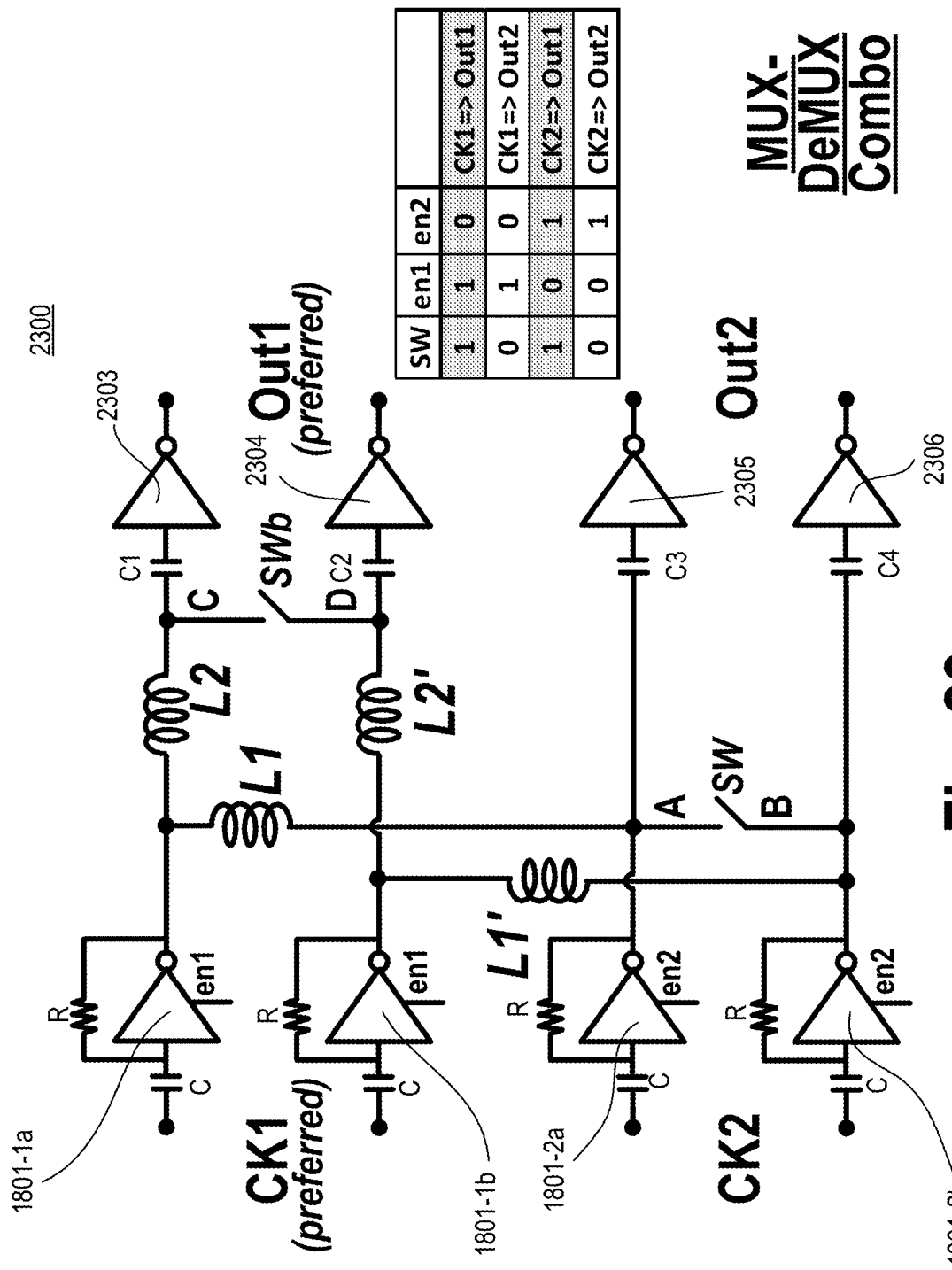
FIG. 23 illustrates a single-stage inductor-based differential Mux-DeMux combo, in accordance with some embodiments.

FIG. 23 illustrates a single-stage inductor-based differential Mux-DeMux combo circuitry 2300 (e.g., 2201), in accordance with some embodiments. In some embodiments, combo circuitry 2300 comprises capacitively coupled tri-stateable inverter circuitries 1800 (having inverters 1801-1a and 1801-1b controllable by enables en1, and inverters 1801-2a and 1801-2b controllable by enables en2) inductors L1, L1', L2, and L2', switch SW between nodes A and B, and switch between nodes C1 and DD, capacitors C1, C2, C3, and C4 (which may all be equal to one another), and output inverters 2303, 2304, 2305, and 2306, coupled as shown.

Combined single-stage inductor-based differential Mux-DeMux combo circuitry 2300 provides best performance for Ck1-→Out1 path and good performance for other combinations. Due to the asymmetric nature of this combo, the best performance is possible in Ck1→Out1 mode of operation. Thus, in some embodiments, the upper band (highest frequency) PLL1 feeds into the Ck1 port whereas the un-divided full-speed clock distribution (HF path of FIG. 22) is connected to the Out1 port. Here, when SW is enabled or closed (SW=1), en1=1 and en2=0, CK1 is provided as Out1. When SW is disabled or open (SW=0), en1=1 and en2=0, CK2 is provided to Out2. When SW is enabled or closed (SW=1), en1=0, and en0=1, CK2 is provided as Out1. When SW is disabled or open (SW=0), en1=0, and en2=1, CK2 is provided as Out2.

Figure 24:
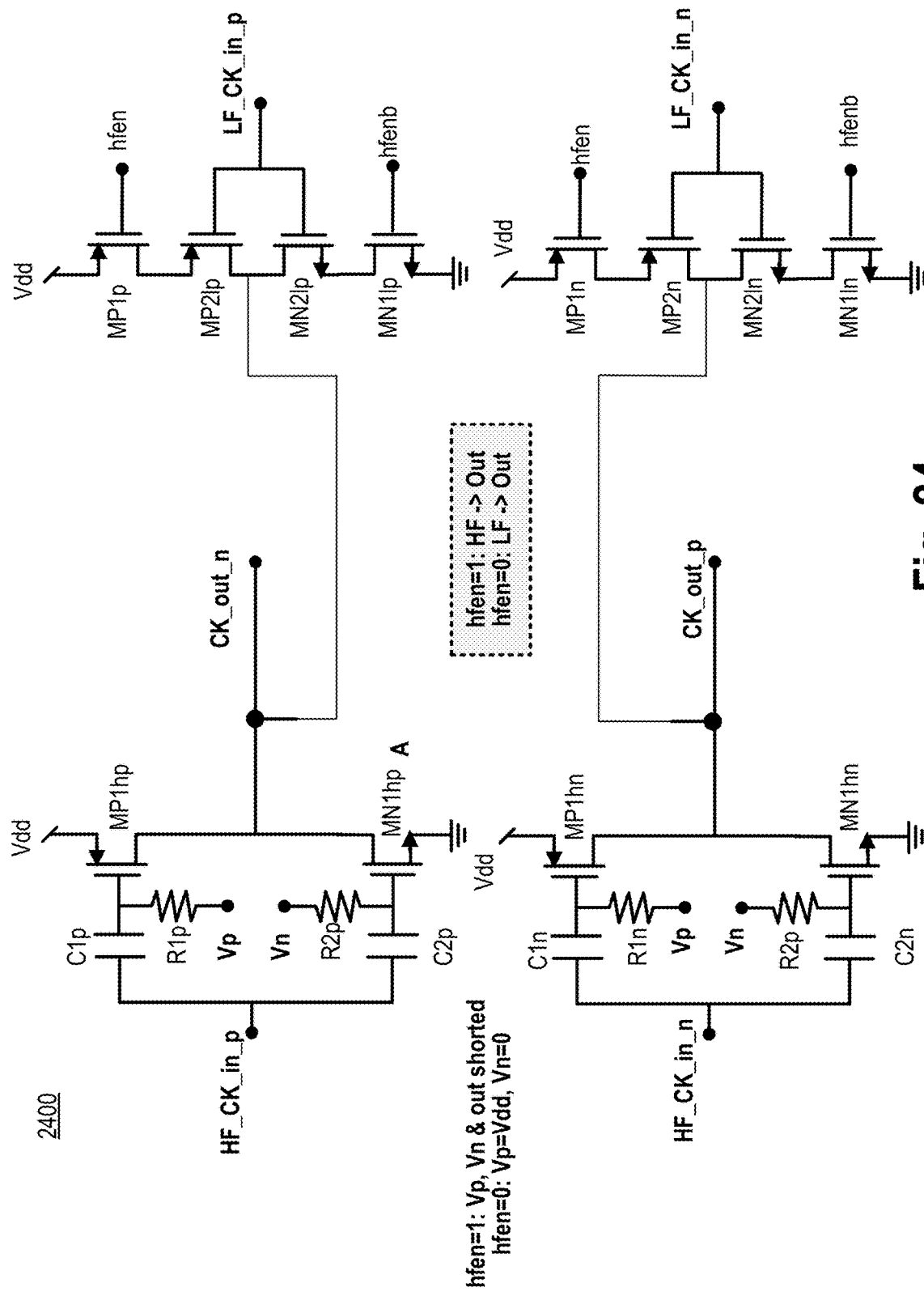
FIG. 24 illustrates an inductor-less differential asymmetric Mux, in accordance with some embodiments.

FIG. 24 illustrates an inductor-less differential asymmetric Mux 2400, in accordance with some embodiments. Compared to Mux 1600, here inductors L1 and L2, and switch SW are removed. Node CK_out_n is shortened to the output of the third tri-state inverter. Node CK_out_p is shortened to the output of the fourth tri-state inverter. As such, when hfen=1, high frequency clock is provided as output. For example, HF_CK_in_p is provided as CK_out_n and HF_CK_in_n is provided as CK_out_p. In some embodiments, when hfen=0, low frequency clock is provided as output. For example, LF_CK_in_n is provided as CK_out_p, and LF_CK_in_p is provided as CK_out_n.

FIG. 25 illustrates eye diagram 2500 of a full-rate 112 Gb/s PRBS-13 NRZ of SerDes Tx using the shunt-series Mux and/or inductor-based differential DeMux, in accordance with some embodiments. In this case, 28 GHz clocks are propagated through the preferred paths of the shunt-series Mux and/or inductor-based differential DeMux.

FIG. 26 illustrates eye diagram 2600 of a full-rate 224 Gb/s PRBS-13 PAM-4 of SerDes Tx using the shunt-series Mux and/or inductor-based differential DeMux, in accordance with some embodiments. In this case, 28 GHz clocks are propagated through the preferred paths of the shunt-series Mux and/or inductor-based differential DeMux.

Figure 27:
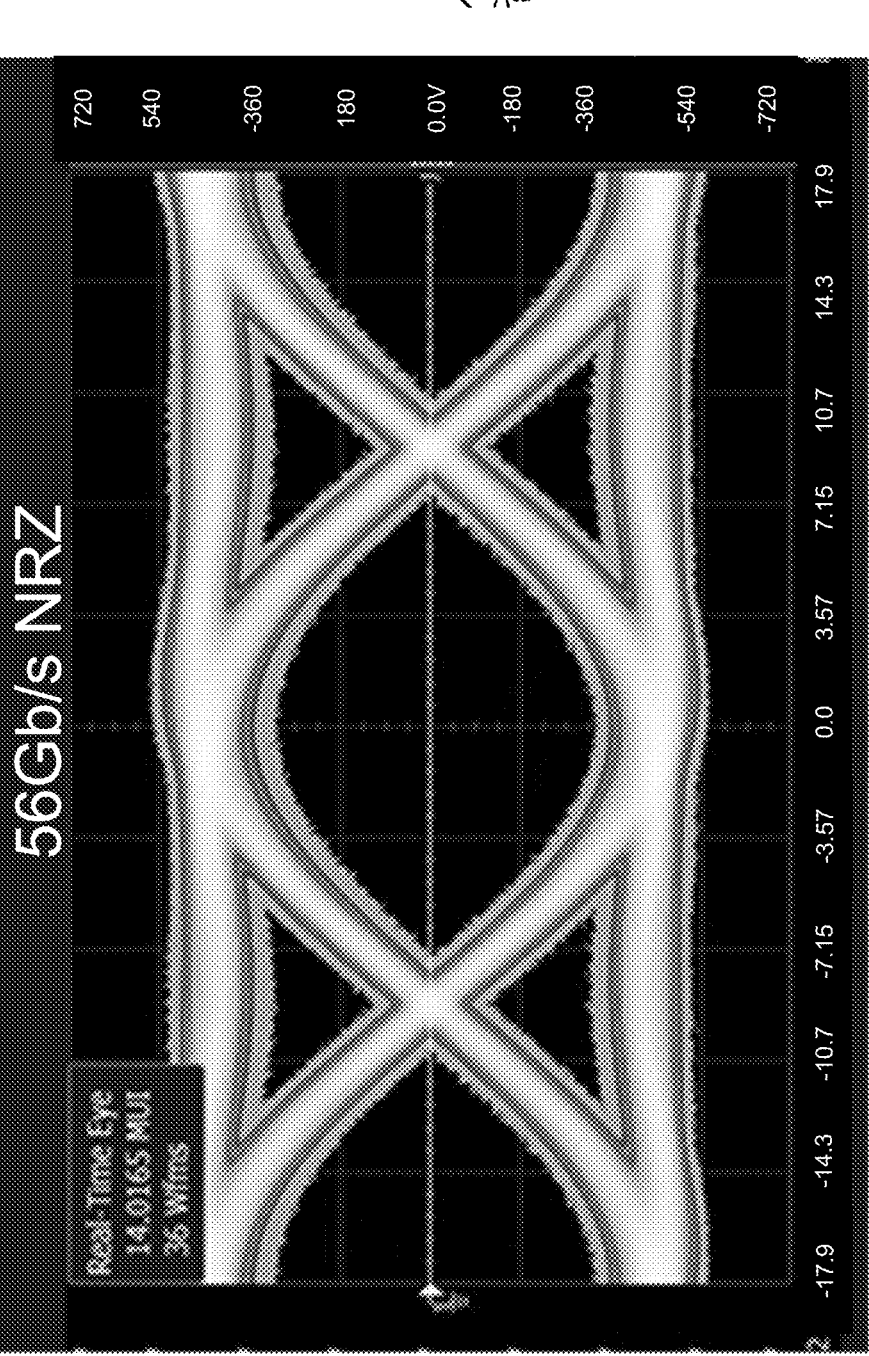
FIG. 27 illustrates an eye diagram of a 56 Gb/s PRBS-13 NRZ eye diagram of a digital-to-analog converter (DAC) Tx using the shunt-series Mux and/or inductor-based differential DeMux, in accordance with some embodiments.

FIG. 27 illustrates eye diagram 2700 of a 56 Gb/s PRBS-13 NRZ eye diagram of a DAC Tx using the shunt-series Mux and/or inductor-based differential DeMux, in accordance with some embodiments. In this case, 14 GHz clocks are propagated through the non-preferred paths of the shunt-series Mux and/or inductor-based differential DeMux.

Figure 28:
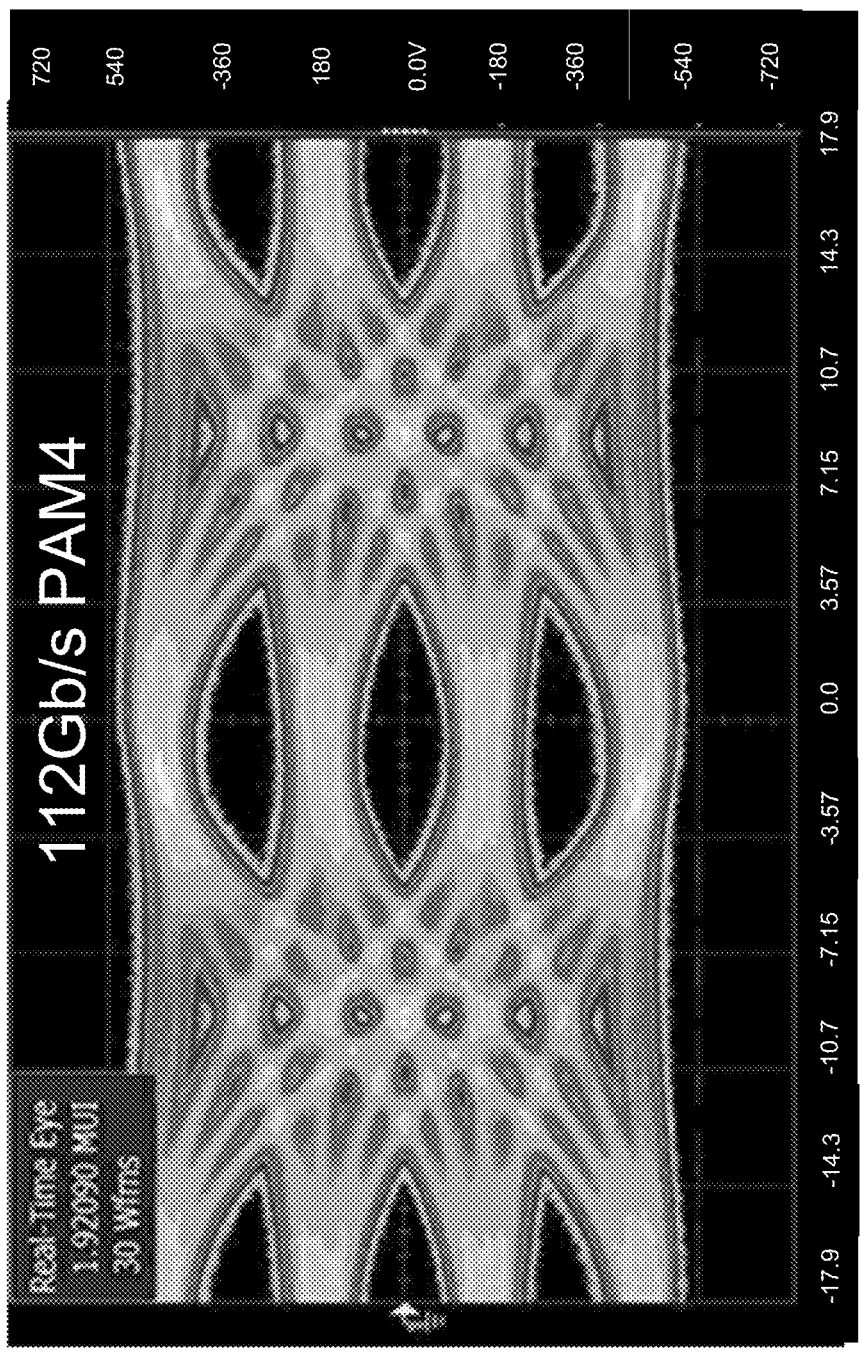
FIG. 28 illustrates an eye diagram of a 112 Gb/s PRBS-13 PAM-4 eye diagram of a DAC Tx using the shunt-series Mux and/or inductor-based differential DeMux, in accordance with some embodiments.

FIG. 28 illustrates eye diagram 2800 of a 112 Gb/s PRBS-13 PAM-4 eye diagram of a DAC Tx using the shunt-series Mux and/or inductor-based differential DeMux, in accordance with some embodiments. In this case, 14 GHz clocks are propagated through the non-preferred paths of the shunt-series Mux and/or inductor-based differential DeMux.

Figure 29:
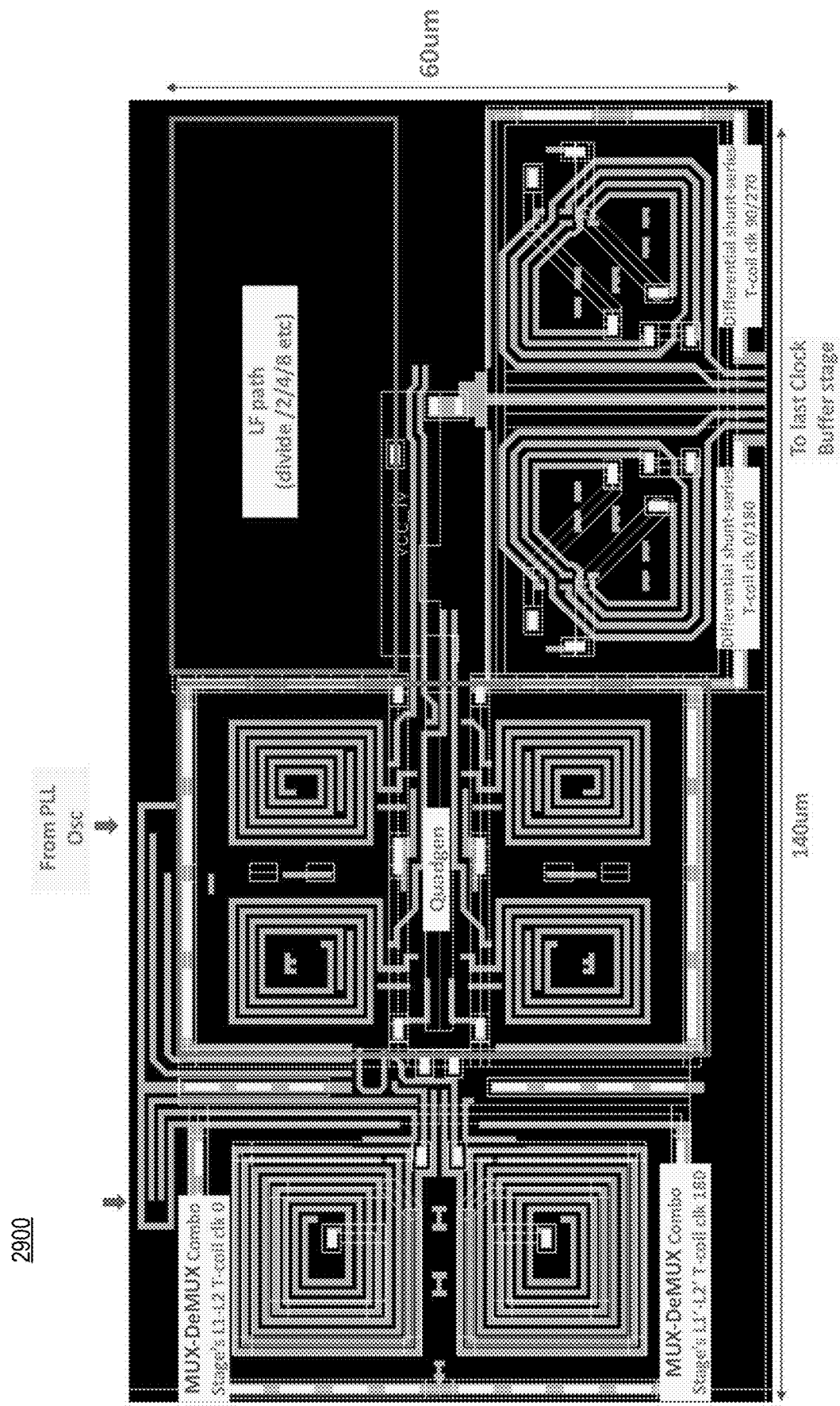
FIG. 29 illustrates a floorplan of a high-speed clock distribution except the last clock buffer stage, and using Mux-DeMux combo circuitries, in accordance with some embodiments.

FIG. 29 illustrates floorplan 2900 of a high-speed clock distribution except the last clock buffer stage, and using Mux-DeMux combo circuitries, in accordance with some embodiments.

Figure 30:
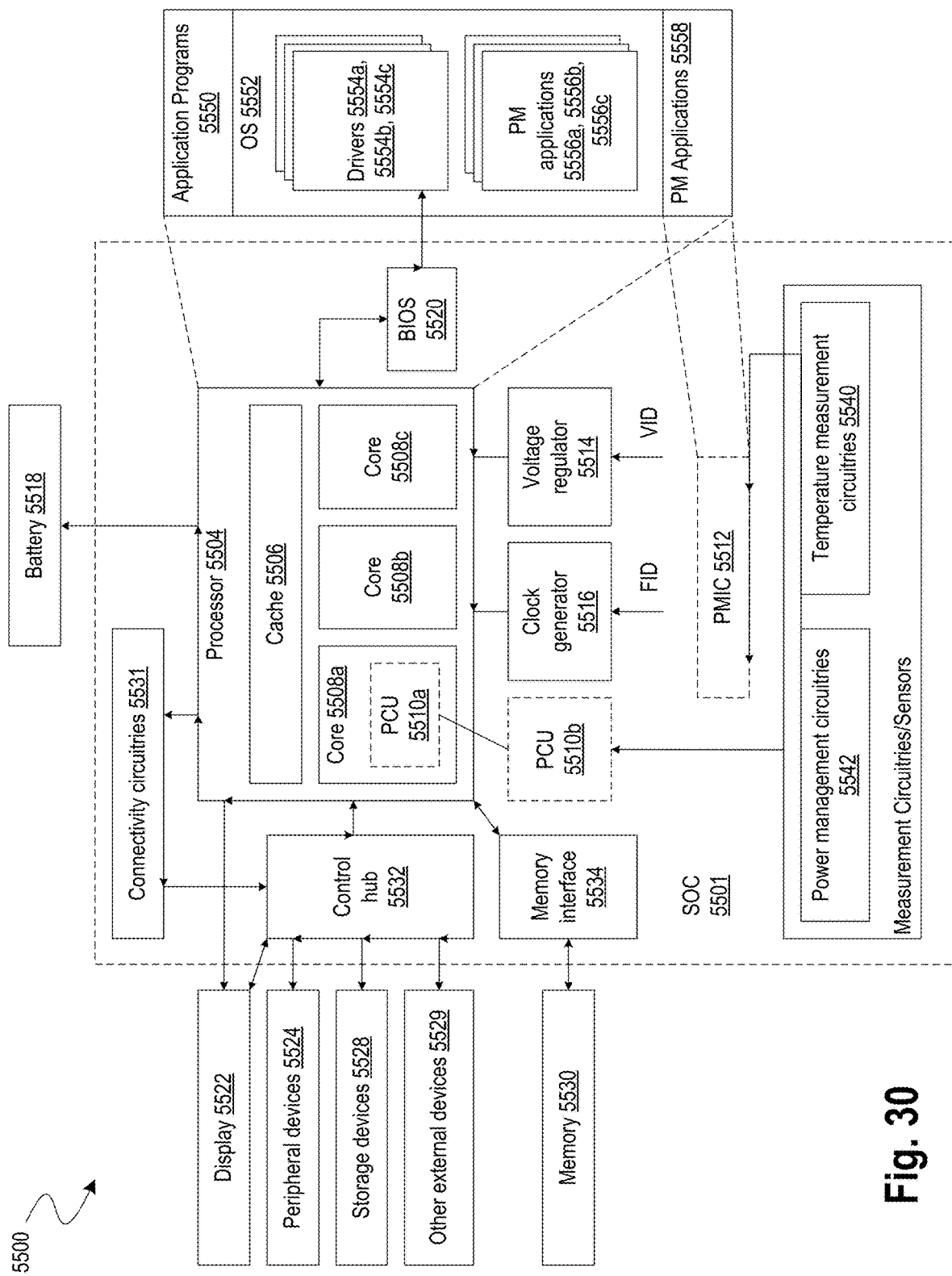
FIG. 30 illustrates a smart device or a computer system or an SoC (System-on-Chip) having shunt-series (and/or series-shunt) peaked inductive clock buffer, shunt-series Mux and/or inductor-based differential DeMux, and/or combo Mux-DeMux circuitry, in accordance with some embodiments.

FIG. 30 illustrates a smart device or a computer system or a SoC (System-on-Chip) 5500 having shunt-series (and/or series-shunt) peaked inductive clock buffer, shunt-series Mux and/or inductor-based differential DeMux, and/or combo Mux-DeMux circuitry, in accordance with some embodiments. It is pointed out that those elements of FIG. 30 having the same reference numbers (or names) as the elements of any other figure may operate or function in any manner similar to that described, but are not limited to such.

In some embodiments, device 5500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 5500.

In an example, the device 5500 comprises an SoC (System-on-Chip) 5501. An example boundary of the SoC 5501 is illustrated using dotted lines in FIG. 30, with some example components being illustrated to be included within SoC 5501—however, SoC 5501 may include any appropriate components of device 5500.

In some embodiments, device 5500 includes processor 5504. Processor 5504 can include one or more physical devices, such as microprocessors, application processors, microcontrollers, programmable logic devices, processing cores, or other processing means. The processing operations performed by processor 5504 include the execution of an operating platform or operating system on which applications and/or device functions are executed. The processing operations include operations related to I/O (input/output) with a human user or with other devices, operations related to power management, operations related to connecting computing device 5500 to another device, and/or the like. The processing operations may also include operations related to audio I/O and/or display I/O.

In some embodiments, processor 5504 includes multiple processing cores (also referred to as cores) 5508a, 5508b, 5508c. Although merely three cores 5508a, 5508b, 5508c are illustrated in FIG. 30, processor 5504 may include any other appropriate number of processing cores, e.g., tens, or even hundreds of processing cores. Processor cores 5508a, 5508b, 5508c may be implemented on a single integrated circuit (IC) chip. Moreover, the chip may include one or more shared and/or private caches, buses or interconnections, graphics and/or memory controllers, or other components.

In some embodiments, processor 5504 includes cache 5506. In an example, sections of cache 5506 may be dedicated to individual cores 5508 (e.g., a first section of cache 5506 dedicated to core 5508a, a second section of cache 5506 dedicated to core 5508b, and so on). In an example, one or more sections of cache 5506 may be shared among two or more of cores 5508. Cache 5506 may be split in different levels, e.g., level 1 (L1) cache, level 2 (L2) cache, level 3 (L3) cache, etc.

In some embodiments, processor core 5504 may include a fetch unit to fetch instructions (including instructions with conditional branches) for execution by the core 5504. The instructions may be fetched from any storage devices such as the memory 5530. Processor core 5504 may also include a decode unit to decode the fetched instruction. For example, the decode unit may decode the fetched instruction into a plurality of micro-operations. Processor core 5504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 5504 may be an out-of-order processor core in one embodiment. Processor core 5504 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 5504 may also include a bus unit to enable communication between components of processor core 5504 and other components via one or more buses. Processor core 5504 may also include one or more registers to store data accessed by various components of the core 5504 (such as values related to assigned app priorities and/or sub-system states (modes) association.

In some embodiments, device 5500 comprises connectivity circuitries 5531. For example, connectivity circuitries 5531 includes hardware devices (e.g., wireless and/or wired connectors and communication hardware) and/or software components (e.g., drivers, protocol stacks), e.g., to enable device 5500 to communicate with external devices. Device 5500 may be separate from the external devices, such as other computing devices, wireless access points or base stations, etc.

In an example, connectivity circuitries 5531 may include multiple different types of connectivity. To generalize, the connectivity circuitries 5531 may include cellular connectivity circuitries, wireless connectivity circuitries, etc. Cellular connectivity circuitries of connectivity circuitries 5531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 5531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 5531 may include a network interface, such as a wired or wireless interface, e.g., so that a system embodiment may be incorporated into a wireless device, for example, a cell phone or personal digital assistant.

In some embodiments, device 5500 comprises control hub 5532, which represents hardware devices and/or software components related to interaction with one or more I/O devices. For example, processor 5504 may communicate with one or more of display 5522, one or more peripheral devices 5524, storage devices 5528, one or more other external devices 5529, etc., via control hub 5532. Control hub 5532 may be a chipset, a Platform Control Hub (PCH), and/or the like.

For example, control hub 5532 illustrates one or more connection points for additional devices that connect to device 5500, e.g., through which a user might interact with the system. For example, devices (e.g., devices 5529) that can be attached to device 5500 include microphone devices, speaker or stereo systems, audio devices, video systems or other display devices, keyboard or keypad devices, or other I/O devices for use with specific applications such as card readers or other devices.

As mentioned above, control hub 5532 can interact with audio devices, display 5522, etc. For example, input through a microphone or other audio device can provide input or commands for one or more applications or functions of device 5500. Additionally, audio output can be provided instead of, or in addition to display output. In another example, if display 5522 includes a touch screen, display 5522 also acts as an input device, which can be at least partially managed by control hub 5532. There can also be additional buttons or switches on computing device 5500 to provide I/O functions managed by control hub 5532. In one embodiment, control hub 5532 manages devices such as accelerometers, cameras, light sensors or other environmental sensors, or other hardware that can be included in device 5500. The input can be part of direct user interaction, as well as providing environmental input to the system to influence its operations (such as filtering for noise, adjusting displays for brightness detection, applying a flash for a camera, or other features).

In some embodiments, control hub 5532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 5522 represents hardware (e.g., display devices) and software (e.g., drivers) components that provide a visual and/or tactile display for a user to interact with device 5500. Display 5522 may include a display interface, a display screen, and/or hardware device used to provide a display to a user. In some embodiments, display 5522 includes a touch screen (or touch pad) device that provides both output and input to a user. In an example, display 5522 may communicate directly with the processor 5504. Display 5522 can be one or more of an internal display device, as in a mobile electronic device or a laptop device or an external display device attached via a display interface (e.g., DisplayPort, etc.). In one embodiment display 5522 can be a head mounted display (HMD) such as a stereoscopic display device for use in virtual reality (VR) applications or augmented reality (AR) applications.

In some embodiments, and although not illustrated in the figure, in addition to (or instead of) processor 5504, device 5500 may include Graphics Processing Unit (GPU) comprising one or more graphics processing cores, which may control one or more aspects of displaying contents on display 5522.

Control hub 5532 (or platform controller hub) may include hardware interfaces and connectors, as well as software components (e.g., drivers, protocol stacks) to make peripheral connections, e.g., to peripheral devices 5524.

It will be understood that device 5500 could both be a peripheral device to other computing devices, as well as have peripheral devices connected to it. Device 5500 may have a "docking" connector to connect to other computing devices for purposes such as managing (e.g., downloading and/or uploading, changing, synchronizing) content on device 5500. Additionally, a docking connector can allow device 5500 to connect to certain peripherals that allow computing device 5500 to control content output, for example, to audiovisual or other systems.

In addition to a proprietary docking connector or other proprietary connection hardware, device 5500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 5531 may be coupled to control hub 5532, e.g., in addition to, or instead of, being coupled directly to the processor 5504. In some embodiments, display 5522 may be coupled to control hub 5532, e.g., in addition to, or instead of, being coupled directly to processor 5504.

In some embodiments, device 5500 comprises memory 5530 coupled to processor 5504 via memory interface 5534. Memory 5530 includes memory devices for storing information in device 5500.

In some embodiments, memory 5530 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 5530 can be a dynamic random-access memory (DRAM) device, a static random-access memory (SRAM) device, flash memory device, phase-change memory device, or some other memory device having suitable performance to serve as process memory. In one embodiment, memory 5530 can operate as system memory for device 5500, to store data and instructions for use when the one or more processors 5504 executes an application or process. Memory 5530 can store application data, user data, music, photos, documents, or other data, as well as system data (whether long-term or temporary) related to the execution of the applications and functions of device 5500.

Elements of various embodiments and examples are also provided as a machine-readable medium (e.g., memory 5530) for storing the computer-executable instructions (e.g., instructions to implement any other processes discussed herein). The machine-readable medium (e.g., memory 5530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 5500 comprises temperature measurement circuitries 5540, e.g., for measuring temperature of various components of device 5500. In an example, temperature measurement circuitries 5540 may be embedded, or coupled or attached to various components, whose temperature are to be measured and monitored. For example, temperature measurement circuitries 5540 may measure temperature of (or within) one or more of cores 5508*a*, 5508*b*, 5508*c*, voltage regulator 5514, memory 5530, a mother-board of SoC 5501, and/or any appropriate component of device 5500. In some embodiments, temperature measurement circuitries 5540 include a low power hybrid reverse (LPHR) bandgap reference (BGR) and digital temperature sensor (DTS), which utilizes subthreshold metal oxide semiconductor (MOS) transistor and the PNP parasitic Bi-polar Junction Transistor (BJT) device to form a reverse BGR that serves as the base for configurable BGR or DTS operating modes. The LPHR architecture uses low-cost MOS transistors and the standard parasitic PNP device. Based on a reverse bandgap voltage, the LPHR can work as a configurable BGR. By comparing the configurable BGR with the scaled base-emitter voltage, the circuit can also perform as a DTS with a linear transfer function with single-temperature trim for high accuracy.

In some embodiments, device 5500 comprises power measurement circuitries 5542, e.g., for measuring power consumed by one or more components of the device 5500. In an example, in addition to, or instead of, measuring power, the power measurement circuitries 5542 may measure voltage and/or current. In an example, the power measurement circuitries 5542 may be embedded, or coupled or attached to various components, whose power, voltage, and/or current consumption are to be measured and monitored. For example, power measurement circuitries 5542 may measure power, current and/or voltage supplied by one or more voltage regulators 5514, power supplied to SoC 5501, power supplied to device 5500, power consumed by processor 5504 (or any other component) of device 5500, etc.

In some embodiments, device 5500 comprises one or more voltage regulator circuitries, generally referred to as voltage regulator (VR) 5514. VR 5514 generates signals at appropriate voltage levels, which may be supplied to operate any appropriate components of the device 5500. Merely as an example, VR 5514 is illustrated to be supplying signals to processor 5504 of device 5500. In some embodiments, VR 5514 receives one or more Voltage Identification (VID) signals, and generates the voltage signal at an appropriate level, based on the VID signals. Various type of VRs may be utilized for the VR 5514. For example, VR 5514 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 5510*a/b* and/or PMIC 5512. In some embodiments, each core has a network of distributed LDOs to provide efficient control for power management. The LDOs can be digital, analog, or a combination of digital or analog LDOs. In some embodiments, VR 5514 includes current tracking apparatus to measure current through power supply rail(s).

In some embodiments, VR 5514 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 5514 is completely eliminated (or substantially eliminated) and there is merely a single undershoot transition which could lead to a guaranteed Vmin based on a comparator delay and the di/dt of the load with the available output decoupling capacitance.

In some embodiments, VR 5514 includes a separate self-start controller, which is functional without fuse and/or trim information. The self-start controller protects VR 5514 against large inrush currents and voltage overshoots, while being capable of following a variable VID (voltage identification) reference ramp imposed by the system. In some embodiments, the self-start controller uses a relaxation oscillator built into the controller to set the switching frequency of the buck converter. The oscillator can be initialized using either a clock or current reference to be close to a desired operating frequency. The output of VR 5514 is coupled weakly to the oscillator to set the duty cycle for closed loop operation. The controller is naturally biased such that the output voltage is always slightly higher than the set point, eliminating the need for any process, voltage, and/or temperature (PVT) imposed trims.

In some embodiments, VR 5514 includes a controlled current source or a parallel current source (PCS) to assist a DC-DC buck converter and to alleviate the stress on the C4 bumps while boosting the efficiency of the DC-DC converter at the high-load current scenarios. The PSC adds current to the output power supply rail, which is coupled to a load. In some embodiments, the PCS is activated to mitigate droop events due to high di/dt events on the output power supply rail. The PCS provides charge directly to the load (driving in parallel to the DC-DC converter) whenever the current supplied by the DC-DC converter is above a certain threshold level.

In some embodiments, device 5500 comprises one or more clock generator circuitries, generally referred to as clock generator 5516. Clock generator 5516 generates clock signals at appropriate frequency levels, which may be supplied to any appropriate components of device 5500. Merely as an example, clock generator 5516 is illustrated to be supplying clock signals to processor 5504 of device 5500. In some embodiments, clock generator 5516 receives one or more Frequency Identification (FID) signals, and generates the clock signals at an appropriate frequency, based on the FID signals.

In some embodiments, device 5500 comprises battery 5518 supplying power to various components of device 5500. Merely as an example, battery 5518 is illustrated to be supplying power to processor 5504. Although not illustrated in the figures, device 5500 may comprise a charging circuitry, e.g., to recharge the battery, based on Alternating Current (AC) power supply received from an AC adapter.

In some embodiments, the charging circuitry (e.g., 5518) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 5500 comprises Power Control Unit (PCU) 5510 (also referred to as Power Management Unit (PMU), Power Management Controller (PMC), Power Unit (p-unit), etc.). In an example, some sections of PCU 5510 may be implemented by one or more processing cores 5508, and these sections of PCU 5510 are symbolically illustrated using a dotted box and labelled PCU 5510a. In an example, some other sections of PCU 5510 may be implemented outside the processing cores 5508, and these sections of PCU 5510 are symbolically illustrated using a dotted box and labelled as PCU 5510b. PCU 5510 may implement various power management operations for device 5500. PCU 5510 may include hardware interfaces, hardware circuitries, connectors, registers, etc., as well as software components (e.g., drivers, protocol stacks), to implement various power management operations for device 5500.

In various embodiments, PCU or PMU 5510 is organized in a hierarchical manner forming a hierarchical power management (HPM). HPM of various embodiments builds a capability and infrastructure that allows for package level management for the platform, while still catering to islands of autonomy that might exist across the constituent die in the package. HPM does not assume a pre-determined mapping of physical partitions to domains. An HPM domain can be aligned with a function integrated inside a dielet, to a dielet boundary, to one or more dielets, to a companion die, or even a discrete CXL device. HPM addresses integration of multiple instances of the same die, mixed with proprietary functions or 3rd party functions integrated on the same die or separate die, and even accelerators connected via CXL (e.g., Flexbus) that may be inside the package, or in a discrete form factor.

HPM enables designers to meet the goals of scalability, modularity, and late binding. HPM also allows PMU functions that may already exist on other dice to be leveraged, instead of being disabled in the flat scheme. HPM enables management of any arbitrary collection of functions independent of their level of integration. HPM of various embodiments is scalable, modular, works with symmetric multi-chip processors (MCPs), and works with asymmetric MCPs. For example, HPM does not need a signal PM controller and package infrastructure to grow beyond reasonable scaling limits. HPM enables late addition of a die in a package without the need for change in the base die infrastructure. HPM addresses the need of disaggregated solutions having dies of different process technology nodes coupled in a single package. HPM also addresses the needs of companion die integration solutions—on and off package. Other technical effects will be evident from the various figures and embodiments.

In some embodiments, device 5500 comprises Power Management Integrated Circuit (PMIC) 5512, e.g., to implement various power management operations for device 5500. In some embodiments, PMIC 5512 is a Reconfigurable Power Management ICs (RPMICs) and/or an IMVP (Intel® Mobile Voltage Positioning). In an example, the PMIC is within an IC die separate from processor 5504. The may implement various power management operations for device 5500. PMIC 5512 may include hardware interfaces, hardware circuitries, connectors, registers, etc., as well as software components (e.g., drivers, protocol stacks), to implement various power management operations for device 5500.

In an example, device 5500 comprises one or both PCU 5510 or PMIC 5512. In an example, any one of PCU 5510 or PMIC 5512 may be absent in device 5500, and hence, these components are illustrated using dotted lines.

Various power management operations of device 5500 may be performed by PCU 5510, by PMIC 5512, or by a combination of PCU 5510 and PMIC 5512. For example, PCU 5510 and/or PMIC 5512 may select a power state (e.g., P-state) for various components of device 5500. For example, PCU 5510 and/or PMIC 5512 may select a power state (e.g., in accordance with the ACPI (Advanced Configuration and Power Interface) specification) for various components of device 5500. Merely as an example, PCU 5510 and/or PMIC 5512 may cause various components of the device 5500 to transition to a sleep state, to an active state, to an appropriate C state (e.g., C0 state, or another appropriate C state, in accordance with the ACPI specification), etc. In an example, PCU 5510 and/or PMIC 5512 may control a voltage output by VR 5514 and/or a frequency of a clock signal output by the clock generator, e.g., by outputting the VID signal and/or the FID signal, respectively. In an example, PCU 5510 and/or PMIC 5512 may control battery power usage, charging of battery 5518, and features related to power saving operation.

The clock generator 5516 can comprise a phase locked loop (PLL), frequency locked loop (FLL), or any suitable clock source. In some embodiments, each core of processor 5504 has its own clock source. As such, each core can operate at a frequency independent of the frequency of operation of the other core. In some embodiments, PCU 5510 and/or PMIC 5512 performs adaptive or dynamic frequency scaling or adjustment. For example, clock frequency of a processor core can be increased if the core is not operating at its maximum power consumption threshold or limit. In some embodiments, PCU 5510 and/or PMIC 5512 determines the operating condition of each core of a processor, and opportunistically adjusts frequency and/or power supply voltage of that core without the core clocking source (e.g., PLL of that core) losing lock when the PCU 5510 and/or PMIC 5512 determines that the core is operating below a target performance level. For example, if a core is drawing current from a power supply rail less than a total current allocated for that core or processor 5504, then PCU 5510 and/or PMIC 5512 can temporality increase the power draw for that core or processor 5504 (e.g., by increasing clock frequency and/or power supply voltage level) so that the core or processor 5504 can perform at higher performance level. As such, voltage and/or frequency can be increased temporality for processor 5504 without violating product reliability.

In an example, PCU 5510 and/or PMIC 5512 may perform power management operations, e.g., based at least in part on receiving measurements from power measurement circuitries 5542, temperature measurement circuitries 5540, charge level of battery 5518, and/or any other appropriate information that may be used for power management. To that end, PMIC 5512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 5510 and/or PMIC 5512 in at least one embodiment to allow PCU 5510 and/or PMIC 5512 to manage processor core energy at least in part based on value(s) detected by one or more of the sensors.

Also illustrated is an example software stack of device 5500 (although not all elements of the software stack are illustrated). Merely as an example, processors 5504 may execute application programs 5550, Operating System 5552, one or more Power Management (PM) specific application programs (e.g., generically referred to as PM applications 5558), and/or the like. PM applications 5558 may also be executed by the PCU 5510 and/or PMIC 5512. OS 5552 may also include one or more PM applications 5556a, 5556b, 5556c. The OS 5552 may also include various drivers 5554a, 5554b, 5554c, etc., some of which may be specific for power management purposes. In some embodiments, device 5500 may further comprise a Basic Input/output System (BIOS) 5520. BIOS 5520 may communicate with OS 5552 (e.g., via one or more drivers 5554), communicate with processors 5504, etc.

For example, one or more of PM applications 5558, 5556, drivers 5554, BIOS 5520, etc. may be used to implement power management specific tasks, e.g., to control voltage and/or frequency of various components of device 5500, to control wake-up state, sleep state, and/or any other appropriate power state of various components of device 5500, control battery power usage, charging of the battery 5518, features related to power saving operation, etc.

In some embodiments, battery 5518 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 5510*a/b* has a capability to enable extra compute and telemetries resources for the runtime support of the pCode. Here pCode refers to a firmware executed by PCU 5510*a/b* to manage performance of the SoC 5501. For example, pCode may set frequencies and appropriate voltages for the processor. Part of the pCode are accessible via OS 5552. In various embodiments, mechanisms and methods are provided that dynamically change an Energy Performance Preference (EPP) value based on workloads, user behavior, and/or system conditions. There may be a well-defined interface between OS 5552 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 5552 by including machine-learning support as part of OS 5552 and either tuning the EPP value that the OS hints to the hardware (e.g., various components of SoC 5501) by machine-learning prediction, or by delivering the machine-learning prediction to the pCode in a manner similar to that done by a Dynamic Tuning Technology (DTT) driver. In this model, OS 5552 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 5552 and the other from software such as DTT, and may selectively choose to provide higher performance and/or responsiveness. As part of this method, the pCode may enable in the DTT an option to tune its reaction for the DTT for different types of activity.

In some embodiments, pCode improves the performance of the SoC in battery mode. In some embodiments, pCode allows drastically higher SoC peak power limit levels (and thus higher Turbo performance) in battery mode. In some embodiments, pCode implements power throttling and is part of Intel's Dynamic Tuning Technology (DTT). In various embodiments, the peak power limit is referred to PL4. However, the embodiments are applicable to other peak power limits. In some embodiments, pCode sets the Vth threshold voltage (the voltage level at which the platform will throttle the SoC) in such a way as to prevent the system from unexpected shutdown (or black screening). In some embodiments, pCode calculates the Psoc,pk SoC Peak Power Limit (e.g., PL4), according to the threshold voltage (Vth). These are two dependent parameters, if one is set, the other can be calculated. pCode is used to optimally set one parameter (Vth) based on the system parameters, and the history of the operation. In some embodiments, pCode provides a scheme to dynamically calculate the throttling level (Psoc,th) based on the available battery power (which changes slowly) and set the SoC throttling peak power (Psoc,th). In some embodiments, pCode decides the frequencies and voltages based on Psoc,th. In this case, throttling events have less negative effect on the SoC performance. Various embodiments provide a scheme which allows maximum performance (Pmax) framework to operate.

In some embodiments, VR 5514 includes a current sensor to sense and/or measure current through a high-side switch of VR 5514. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

In some embodiments, the processor includes a fully-unrolled SHA256 datapath featuring a latch-based pipeline design clocked by 3-phase non-overlapping clocks. A scheme to improve throughput (performance) by modulating the clock duty cycle in a deterministic way to reduce the dead time in the latch-based pipeline design to a minimum that is needed in silicon. This DLL in a clock path is used to generate a non-50% duty cycle clock. The extra high phase of the clock increases the time the latch is transparent. With the introduction of the DLL the dead time is kept to just the time a particular part needs to satisfy hold time requirements. Another scheme is described to reduce glitch power where a circuit element (e.g., latch) is introduced to act as a glitch gate. The latch prevents the early toggling signals from propagating. It is timed such that the logic that gets resolved the last passes through the latch.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Here the term "supervisor" generally refers to a power controller, or power management, unit (a "p-unit"), which monitors and manages power and performance related parameters for one or more associated power domains, either alone or in cooperation with one or more other p-units. Power/performance related parameters may include but are not limited to domain power, platform power, voltage, voltage domain current, die current, load-line, temperature, utilization, clock frequency, processing efficiency, current/future workload information, and other parameters. It may determine new power or performance parameters (limits, average operational, etc.) for the one or more domains. These parameters may then be communicated to supervisee p-units, or directly to controlled or monitored entities such as VR or clock throttle control registers, via one or more fabrics and/or interconnects. A supervisor learns of the workload (present and future) of one or more dies, power measurements of the one or more dies, and other parameters (e.g., platform level power boundaries) and determines new power limits for the one or more dies. These power limits are then communicated by supervisor p-units to the supervisee p-units via one or more fabrics and/or interconnect. In examples where a die has one p-unit, a supervisor (Svor) p-unit is also referred to as supervisor die.

Here the term "supervisee" generally refers to a power controller, or power management, unit (a "p-unit"), which monitors and manages power and performance related parameters for one or more associated power domains, either alone or in cooperation with one or more other p-units and receives instructions from a supervisor to set power and/or performance parameters (e.g., supply voltage, operating frequency, maximum current, throttling threshold, etc.) for its associated power domain. In examples where a die has one p-unit, a supervisee (Svee) p-unit may also be referred to as a supervisee die. Note that a p-unit may serve either as a Svor, a Svee, or both a Svor/Svee p-unit Here, the term "processor core" generally refers to an independent execution unit that can run one program thread at a time in parallel with other cores. A processor core may include a dedicated power controller or power control unit (p-unit) which can be dynamically or statically configured as a supervisor or supervisee. This dedicated p-unit is also referred to as an autonomous p-unit, in some examples. In some examples, all processor cores are of the same size and functionality i.e., symmetric cores. However, processor cores can also be asymmetric. For example, some processor cores have different size and/or function than other processor cores. A processor core can be a virtual processor core or a physical processor core.

Here the term "die" generally refers to a single continuous piece of semiconductor material (e.g. silicon) where transistors or other components making up a processor core may reside. Multi-core processors may have two or more processors on a single die, but alternatively, the two or more processors may be provided on two or more respective dies. Each die has a dedicated power controller or power control unit (p-unit) power controller or power control unit (p-unit) which can be dynamically or statically configured as a supervisor or supervisee. In some examples, dies are of the same size and functionality i.e., symmetric cores. However, dies can also be asymmetric. For example, some dies have different size and/or function than other dies.

Here, the term "interconnect" refers to a communication link, or channel, between two or more points or nodes. It may comprise one or more separate conduction paths such as wires, vias, waveguides, passive components, and/or active components. It may also comprise a fabric.

Here the term "interface" generally refers to software and/or hardware used to communicate with an interconnect. An interface may include logic and I/O driver/receiver to send and receive data over the interconnect or one or more wires.

Here the term "fabric" generally refers to communication mechanism having a known set of sources, destinations, routing rules, topology and other properties. The sources and destinations may be any type of data handling functional unit such as power management units. Fabrics can be two-dimensional spanning along an x-y plane of a die and/or three-dimensional (3D) spanning along an x-y-z plane of a stack of vertical and horizontally positioned dies. A single fabric may span multiple dies. A fabric can take any topology such as mesh topology, star topology, daisy chain topology. A fabric may be part of a network-on-chip (NoC) with multiple agents. These agents can be any functional unit.

Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets. Each dielet may include one or more p-units which can be dynamically or statically configured as a supervisor, supervisee or both.

Here the term "domain" generally refers to a logical or physical perimeter that has similar properties (e.g., supply voltage, operating frequency, type of circuits or logic, and/or workload type) and/or is controlled by a particular agent. For example, a domain may be a group of logic units or function units that are controlled by a particular supervisor. A domain may also be referred to an Autonomous Perimeter (AP). A domain can be an entire system-on-chip (SoC) or part of the SoC, and is governed by a p-unit.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising a first driver to receive a first input and having a first output; a second driver to receive a second input and having a second output, wherein the first input is complementary of the second input; a first shunt-series set of inductors coupled to the first output; and a second shunt-series set of inductors coupled to the second output, wherein the first shunt-series set of inductors is coupled to the second shunt-series set of inductors via a switch.

Example 2: The apparatus of example 1 comprising a memory element coupled to the first output and the second output.

Example 3: The apparatus of example 2, wherein the memory element comprises cross-coupled inverters.

Example 4: The apparatus of example 3, wherein the cross-coupled inverters are about eight times smaller than the first driver or the second driver.

Example 5: The apparatus of example 1, wherein the first driver comprises a first inverter, and wherein the second driver comprises a second inverter.

Example 6: The apparatus of example 1, wherein the first and second drivers are power gated.

Example 7: The apparatus of example 1, wherein the first shunt-series set of inductors comprises: a first inductor coupled in series between the first output and a third output; and a second inductor coupled with the first output and the switch.

Example 8: The apparatus of example 3, wherein the second shunt-series set of inductors comprises: a third inductor coupled in series between the second output and a fourth output; and a fourth inductor coupled with the second output and the switch.

Example 9: The apparatus of example 1, wherein when the switch is on, the first shunt-series set of inductors is electrically coupled to the second shunt-series set of inductors, for normal operation, wherein when the switch is off, the first shunt-series set of inductors is electrically decoupled to the second shunt-series set of inductors, for low frequency operation.

Example 10: An apparatus comprising: a first driver to receive a first input and having a first output; a second driver to receive a second input and having a second output, wherein the first input is complementary of the second input; a first shunt-series set of inductors coupled to the first output; and a second shunt-series set of inductors coupled to the second output, wherein the first shunt-series set of inductors is coupled to the second shunt-series set of inductors via a switch.

Example 11: The apparatus of example 10 comprising a memory element coupled to the first output and the second output.

Example 12: The apparatus of example 10, wherein the first series-shunt set of inductors comprises: a first inductor coupled in series between the first output and a third output; and a second inductor coupled with the third output and the switch.

Example 13: The apparatus of claim 12, wherein the second series-shunt set of inductors comprises: a third inductor coupled in series between the second output and a fourth output; and a fourth inductor coupled with the fourth output and the switch.

Example 14: The apparatus of example 13, wherein the second inductor has an inductance which is about equal to an inductance of the first inductor, and wherein the fourth inductor has an inductance which is about equal to an inductance of the third inductor.

Example 15: The apparatus of example 13, wherein the second inductor has an inductance which is about three times higher than an inductance of the first inductor, and wherein the fourth inductor has an inductance which is about three times higher than an inductance of the third inductor.

Example 16: A system comprising: a processor; a memory coupled to the processor; a wireless interface to allow the processor to communicate with another device, wherein the processor includes a serial-deserializer transmitter, which includes a clock buffer comprising: a first driver to receive a first input and having a first output; a second driver to receive a second input and having a second output, wherein the first input is complementary of the second input; a first shunt-series set of inductors coupled to the first output; and a second shunt-series set of inductors coupled to the second output, wherein the first shunt-series set of inductors is coupled to the second shunt-series set of inductors via a switch.

Example 17: The system of example 16, wherein the clock buffer comprising a memory element coupled to the first output and the second output.

Example 18: The system of example 17, wherein the memory element comprises cross-coupled inverters.

Example 19: The system of example 18, wherein the cross-coupled inverters are about eight times smaller than the first driver or the second driver.

Example 20: The system of example 16, wherein the first driver comprises a first inverter, and wherein the second driver comprises a second inverter.

Example 21: An apparatus comprising: a first tri-stateable driver to receive a first clock, the first tri-stateable driver having a first output; a second tri-stateable driver to receive a second clock, wherein the second clock is a complementary of the first clock, the second tri-stateable driver having a second output; a third tri-stateable driver to receive a third clock; a fourth tri-stateable driver to receive a fourth clock, wherein the fourth clock is a complementary of the third clock, wherein the first clock is faster than the third clock; a first inductor coupled to an output of the first driver and an output of the third driver; a second inductor coupled to an output of the second driver and an output of the fourth driver; and a second switch to couple the first inductor with the second inductor.

Example 22: The apparatus of example 21, wherein the first and second tri-stateable drivers drive the first and second clocks to the first and second outputs, respectively, when the switch is turned on.

Example 23: The apparatus of example 21, wherein when the first and second tri-stateable drivers are enabled, and third and fourth tri-stateable drivers are disabled, the first and second tri-stateable drivers drive the first and second clocks to the first and second outputs, respectively, when the switch is turned on.

Example 24: The apparatus of example 21, wherein when the first and second tri-stateable drivers are disabled, and third and fourth tri-stateable drivers are enabled, the third and fourth tri-stateable drivers drive the third and fourth clocks to the first and second outputs, respectively, when the switch is turned off.

Example 25: An apparatus comprising: a first capacitively coupled tri-stateable driver to receive a first clock, the first capacitively coupled tri-stateable driver having a first output; a second capacitively tri-stateable driver to receive a second clock, wherein the second clock is a complementary of the first clock, the second capacitively coupled tri-stateable driver having a second output; a third tri-stateable driver to receive a third clock; a fourth tri-stateable driver to receive a fourth clock, wherein the fourth clock is a complementary of the third clock, wherein the first clock is faster than the third clock; a first inductor coupled to an output of the first driver and an output of the third driver; a second inductor coupled to an output of the second driver and an output of the fourth driver; and a second switch to couple the first inductor with the second inductor.

Example 26: The apparatus of example 25, wherein the first capacitively coupled tri-stateable driver comprises: a first capacitor coupled to a node to receive the first clock; a first resistor coupled to the first capacitor and a first bias node; and a p-type transistor coupled to a supply node and the first output, wherein a gate of the p-type transistor is coupled to the first capacitor.

Example 27: The apparatus of example 26, wherein the first capacitively coupled tri-stateable driver comprises: a second capacitor coupled to a node to receive the first clock; a second resistor coupled to the second capacitor and a second bias node; and an n-type transistor coupled to a ground node and the second output, wherein a gate of the n-type transistor is coupled to the second capacitor.

Example 28: The apparatus of example 25, wherein the first and second capacitively coupled tri-stateable drivers drive the first and second clocks to the first and second outputs, respectively when the switch is turned on.

Example 29: The apparatus of example 25, wherein when the first and second tri-stateable drivers are enabled, and third and fourth capacitively coupled tri-stateable drivers are disabled, the first and second capacitively coupled tri-stateable drivers drive the first and second clocks to the first and second outputs, respectively, when the switch is turned on.

Example 30: The apparatus of example 25, wherein when the first and second capacitively coupled tri-stateable drivers are disabled, and third and fourth capacitively coupled tri-stateable drivers are enabled, the third and fourth capacitively coupled tri-stateable drivers drive the third and fourth clocks to the first and second outputs, respectively, when the switch is turned off.

Example 31: The apparatus of example 26, wherein the first capacitively coupled tri-stateable driver comprises: a p-type transistor coupled to a supply node; a first capacitor coupled to a clock input and a gate of the p-type transistor; an n-type transistor coupled to a ground node; a second capacitor coupled to the clock input and a gate of the n-type transistor; a first resistor coupled to the gate of the p-type transistor; a first switch controllable by a first enable, the first switch coupled to a first bias; a second switch controllable by a second enable, the second switch coupled the first resistor; and a third resistor coupled to the second switch, the third resistor coupled to the p-type transistor and the n-type transistor.

Example 32: The apparatus of example 31, wherein the first capacitively coupled tri-stateable driver comprises: a third resistor coupled to the gate of the n-type transistor; a third switch controllable by the first enable, the third switch coupled to a second bias; and a fourth switch controllable by the second enable, the fourth switch coupled the second resistor and the third resistor.

Example 33: An apparatus comprising: a first capacitively coupled tri-stateable driver having a first input coupled to a first clock, wherein the first capacitively coupled tri-stateable driver has a first output; a first inductor having a first terminal coupled to the first output, and a second terminal coupled to a first clock output; a switch; and a second inductor having a first terminal coupled to the first output, and a second terminal coupled to the switch.

Example 34: The apparatus of example 33 comprising: a second capacitively coupled tri-stateable driver having a second input coupled to a second clock, wherein the second capacitively coupled tri-stateable driver has a second output, wherein the second clock in an inverse of the first clock; a third inductor having a first terminal coupled to the second output, and a second terminal coupled to a second clock output; and a fourth inductor having a first terminal coupled to the second output, and a second terminal coupled to the switch.

Example 35: The apparatus of example 34 comprising: a third capacitively coupled tri-stateable driver having a third input and a third output, wherein the third input is coupled to a third clock, wherein the third output is coupled to the switch and the second inductor.

Example 36: The apparatus of example 35 comprising: a fourth capacitively coupled tri-stateable driver having a fourth input and a fourth output, wherein the fourth input is coupled to a fourth clock, wherein the fourth output is coupled to the switch and the fourth inductor, wherein the fourth clock is an inverse of the third clock.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a first driver to receive a first input and having a first driver output;
   a second driver to receive a second input and having a second driver output, wherein the first input is complementary of the second input;
   a first shunt-series set of inductors coupled to the first driver output; and
   a second shunt-series set of inductors coupled to the second driver output, wherein the first shunt-series set of inductors is coupled to the second shunt-series set of inductors via a switch, wherein the first shunt-series set of inductors includes: (i) a first inductor coupled between the first driver output and the switch, and (ii) a second inductor coupled between the first driver output and a first output node.

2. The apparatus of claim 1 comprising a memory element coupled to the first output and the second output.

3. The apparatus of claim 2, wherein the memory element comprises cross-coupled inverters.

4. The apparatus of claim 3, wherein the cross-coupled inverters are about eight times smaller than the first driver or the second driver.

5. The apparatus of claim 1, wherein the first driver comprises a first inverter, and wherein the second driver comprises a second inverter.

6. The apparatus of claim 1, wherein the first and second drivers are power gated.

7. The apparatus of claim 1, wherein the first shunt-series set of inductors comprises:
   a first inductor coupled in series between the first output and a third output; and
   a second inductor coupled with the first output and the switch.

8. The apparatus of claim 3, wherein the second shunt-series set of inductors comprises:
   a third inductor coupled in series between the second output and a fourth output; and
   a fourth inductor coupled with the second output and the switch.

9. The apparatus of claim 1, wherein when the switch is on, the first shunt-series set of inductors is electrically coupled to the second shunt-series set of inductors, for normal operation, wherein when the switch is off, the first shunt-series set of inductors is electrically de-coupled to the second shunt-series set of inductors, for low frequency operation.

10. An apparatus comprising:
    a first driver to receive a first input and having a first driver output;
    a second driver to receive a second input and having a second driver output, wherein the first input is complementary of the second input;
    a first series-shunt set of inductors coupled to the first driver output; and
    a second series-shunt set of inductors coupled to the second driver output, wherein the first series-shunt set of inductors is coupled to the second series-shunt set of inductors via a switch, wherein the first series-shunt set of inductors includes: (i) a first inductor coupled between the first driver output and a first output node, and (ii) a second inductor coupled between the first output node and the switch.

11. The apparatus of claim 10 comprising a memory element coupled to the first output and the second output.

12. The apparatus of claim 10, wherein the first series-shunt set of inductors comprises:
    a first inductor coupled in series between the first output and a third output; and
    a second inductor coupled with the third output and the switch.

13. The apparatus of claim 12, wherein the second series-shunt set of inductors comprises:
    a third inductor coupled in series between the second output and a fourth output; and
    a fourth inductor coupled with the fourth output and the switch.

14. The apparatus of claim 13, wherein the second inductor has an inductance which is about equal to an inductance of the first inductor, and wherein the fourth inductor has an inductance which is about equal to an inductance of the third inductor.

15. The apparatus of claim 13, wherein the second inductor has an inductance which is about three times higher than an inductance of the first inductor, and wherein the fourth inductor has an inductance which is about three times higher than an inductance of the third inductor.

16. A system comprising:
a processor;
a memory coupled to the processor;
a wireless interface to allow the processor to communicate with another device, wherein the processor includes a serial-deserializer transmitter, which includes a clock buffer comprising:
a first driver to receive a first input and having a first output;
a second driver to receive a second input and having a second output, wherein the first input is complementary of the second input;
a first shunt-series set of inductors coupled to the first output; and
a second shunt-series set of inductors coupled to the second output, wherein the first shunt-series set of inductors is coupled to the second shunt-series set of inductors via a switch.

17. The system of claim 16, wherein the clock buffer comprising a memory element coupled to the first output and the second output.

18. The system of claim 17, wherein the memory element comprises cross-coupled inverters.

19. The system of claim 18, wherein the cross-coupled inverters are about eight times smaller than the first driver or the second driver.

20. The system of claim 16, wherein the first driver comprises a first inverter, and wherein the second driver comprises a second inverter.

* * * * *